(12) United States Patent
Seidemann et al.

(10) Patent No.: US 11,127,813 B2
(45) Date of Patent: Sep. 21, 2021

(54) SEMICONDUCTOR INDUCTORS

(71) Applicant: Intel Corporation, Santa Clara, CA (US)

(72) Inventors: Georg Seidemann, Landshut (DE); Bernd Waidhas, Pettendorf (DE); Thomas Wagner, Regelsbach (DE); Andreas Wolter, Regensburg (DE); Andreas Augustin, Munich (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/617,548

(22) PCT Filed: Jun. 30, 2017

(86) PCT No.: PCT/US2017/040381
§ 371 (c)(1),
(2) Date: Nov. 27, 2019

(87) PCT Pub. No.: WO2019/005124
PCT Pub. Date: Jan. 3, 2019

(65) Prior Publication Data
US 2020/0185490 A1 Jun. 11, 2020

(51) Int. Cl.
*H01L 23/00* (2006.01)
*H01L 21/00* (2006.01)
(Continued)

(52) U.S. Cl.
CPC ............ *H01L 28/10* (2013.01); *H01F 17/04* (2013.01); *H01L 21/02447* (2013.01);
(Continued)

(58) Field of Classification Search
CPC ............ H01L 21/02447; H01L 21/565; H01L 21/7688; H01L 23/645; H01L 23/49816;
(Continued)

(56) References Cited

U.S. PATENT DOCUMENTS 7,405,698 B2 * 7/2008 de Rochemont .. H01Q 21/0025
343/700 MS
7,875,911 B2 * 1/2011 Takagi ................. H01L 23/5227
257/276

(Continued)

FOREIGN PATENT DOCUMENTS

KR 20030051033 6/2003

OTHER PUBLICATIONS

International Search Report and Written Opinion from related application PCT/US2017/040381 dated Mar. 21, 2018.
(Continued)

*Primary Examiner* — Nikolay K Yushin
(74) *Attorney, Agent, or Firm* — Schwabe, Williamson & Wyatt, P.C.

(57) ABSTRACT

The present disclosure is directed to systems and methods for fabricating a semiconductor inductor that includes a coil deposited on a stop layer that is deposited on a sacrificial substrate. The semiconductor inductor may be fabricated on a silicon wafer and singulated. The sacrificial substrate beneficially provides structural support for the singulated semiconductor inductor. The singulated semiconductor inductor advantageously requires minimal active die surface area. The removal of the sacrificial substrate after coupling to the active die beneficially reduces the overall thickness (or height) of the semiconductor package, providing a decided advantage in low profile, portable, electronic devices.

25 Claims, 14 Drawing Sheets

(51) Int. Cl.
*H01L 49/02* (2006.01)
*H01F 17/04* (2006.01)
*H01L 21/02* (2006.01)
*H01L 21/56* (2006.01)
*H01L 23/64* (2006.01)

(52) U.S. Cl.
CPC .......... *H01L 21/565* (2013.01); *H01L 23/645* (2013.01); *H01L 24/13* (2013.01)

(58) Field of Classification Search
CPC ... H01L 23/481; H01L 23/5389; H01L 24/13; H01L 24/11; H01L 24/18; H01L 24/16; H01L 24/48; H01L 25/16; H01L 25/18; H01L 28/10; H01L 2224/16225; H01L 2224/13155; H01L 2224/06524; H01L 2224/32225; H01L 2224/45099; H01F 17/04; H01F 17/0033; H01F 17/0013; H01F 17/0066; H01F 17/02
See application file for complete search history.

(56) References Cited

U.S. PATENT DOCUMENTS

| | | | |
|---|---|---|---|
| 9,799,721 B2* | 10/2017 | Kuo | .................. H01L 28/10 |
| 2004/0191977 A1 | 9/2004 | Li et al. | |
| 2006/0092079 A1* | 5/2006 | de Rochemont | .... H01Q 15/006 343/700 MS |
| 2007/0023862 A1* | 2/2007 | Takagi | ................ H01L 23/5227 257/531 |
| 2012/0086102 A1 | 4/2012 | Hofmann et al. | |
| 2014/0285305 A1 | 9/2014 | Yoo et al. | |
| 2015/0255391 A1 | 9/2015 | Luo et al. | |
| 2016/0307991 A1* | 10/2016 | Kuo | ................... H01L 23/5227 |

OTHER PUBLICATIONS

International Preliminary Report on Patentability from related application PCT/US2017/040381 dated Dec. 31, 2019.

* cited by examiner

SEMICONDUCTOR INDUCTORS

CROSS-REFERENCE TO RELATED APPLICATIONS

This application is a U.S. National Phase Application under 35 U.S.C. § 371 of International Application No. PCT/US2017/040381, filed on Jun. 30, 2017, the entire contents of which is hereby incorporated by reference herein.

TECHNICAL FIELD

The present disclosure relates to the inductors used on semiconductor dies.

BACKGROUND

Inductors, both hollow and magnetic core, are used in conjunction with semiconductor circuits. Planar inductors may consume considerable die surface area. Given the increasing emphasis on smaller and miniaturized devices, increasing die surface area frequently is either not an option or presents an extremely unattractive option that may increase the size of the host device.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
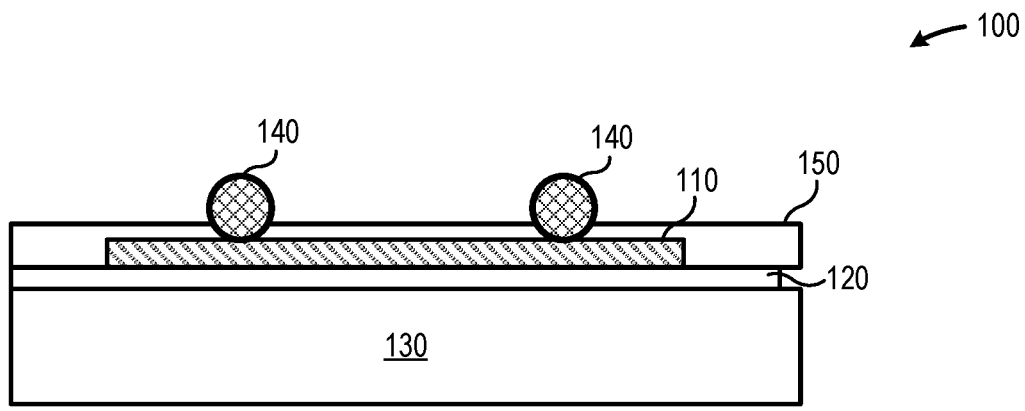
FIG. 1 is a cross-section of an illustrative semiconductor inductor in which a coil is patterned or otherwise deposited on a stop layer that has been deposited on a sacrificial substrate, such as a silicon wafer, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein hollow-core and magnetic-core inductors that may be coupled to a semiconductor die during the packaging process. A coil may be patterned or otherwise formed on a stop layer that has been deposited on a sacrificial substrate material, e.g., a silicon wafer. The coil may be covered with a dielectric material and channels or vias may be formed in the dielectric material, exposing the coil. Conductive members such as solder balls, solder bumps, or conductive pillars may be deposited, inserted, or otherwise formed in the channels or vias to conductively couple the coil to an external circuit, such as found on a semiconductor die.

All or a portion of the sacrificial substrate may be removed in the region of the structure proximate the coil. A magnetic material, such as a magnetic paste, may be deposited proximate the coil after removal of the sacrificial substrate. In embodiments the planar (i.e., two-dimensional) coil may be encapsulated and coupled to a semiconductor die using the previously deposited conductive members. Alternatively, additional coils may be stacked to provide a three dimensional coil structure using a similar construction technique: invert the coil, use the conductive members to conductively couple to the underlying coil, and remove the sacrificial substrate. Any number of coils, each having one or more turns, may be combined.

In embodiments, a gap may exist between the coil and the surface of the semiconductor die and, for stacked coils, between successive coil turns in the stack. In some implementations, the gap between the lowermost coil in the stack and the semiconductor die surface may be partially or filled by flowing an electrically insulating adhesive or underfill material between the lowermost coil in the stack and the surface of the semiconductor die. Similarly, the gaps between successive coils may be filled by flowing an electrically insulating adhesive or underfill material between successive coils.

The systems and methods described herein provide a single- or multi-turn coil that may be conductively coupled to an active die at the wafer level, i.e., prior to die singulation. The coil is formed on a stop layer deposited on a sacrificial substrate, such as a silicon carrier die. Conductive structures, such as solder balls or conductive columns may be coupled to the coil and the coil encapsulated using a dielectric material. The coil may be coupled to an active die that is subsequently fully encapsulated, leaving only the sacrificial substrate exposed. Since the active die is encapsulated, the sacrificial substrate may be thinned or completely removed, for example using a wet-etch or plasma-etch, without exposing the active die to the etchant. Consequently, only the coil stack remains coupled to the active die after etching.

Such construction offers significant, non-trivial, advantages that include: the thinnest possible coil structure for attachment to the active die since the sacrificial substrate may be partially or completely removed from the coil; compatibility with wafer level chip scale packaging (WLCSP) with the coil attached by the conductive members to the active die and using a removable resist as a first encapsulant; compatibility with existing manufacturing equipment and stack-up permitting the use of multiple materials (copper, aluminum, etc.) in a variety of line widths and thicknesses for coil fabrication; reduced area requirements on the active die; and, no handling of thin coil components.

A semiconductor inductor is provided. The semiconductor inductor may include: a first sacrificial substrate having a thickness, a first surface and a transversely opposed second surface; a first stop layer deposited across at least a portion of the first surface of the first sacrificial substrate; a first coil having a first surface and a second surface deposited across at least a portion of the first stop layer opposite the first sacrificial substrate; a first dielectric layer having a thickness disposed at least partially across the first coil; and at least one first conductive structure conductively coupled to the first coil and extending through the first dielectric layer thickness and projecting at least partially from the surface of the first dielectric layer opposite the first coil.

A method of fabricating a first semiconductor inductor is provided. The method may include: depositing a first stop layer across at least a portion of a first surface of a first sacrificial substrate; forming a first coil having a first surface and an opposed second surface across at least a portion of the first stop layer opposite the first sacrificial substrate; depositing a first dielectric layer having a thickness at least partially across the first coil; and conductively coupling at least one first conductive structure to the first coil, the at least one first conductive structure extending through the thickness of the first dielectric layer and projecting at least partially from the surface of the first dielectric layer opposite the first coil.

A semiconductor package is provided. The semiconductor package may include: a semiconductor die; a semiconductor inductor conductively coupled to the semiconductor die, the semiconductor inductor including: a first sacrificial substrate having a thickness, a first surface and a second surface; a first stop layer deposited across at least a portion of the first surface of the first sacrificial substrate; a first coil having a first surface and a second surface deposited across at least a portion of the first stop layer opposite the first sacrificial substrate; a first dielectric layer having a thickness disposed at least partially across the first coil; and at least one first conductive structure conductively coupled to the first coil and extending through the thickness of the first dielectric layer and projecting at least partially from the surface of the first dielectric layer opposite the first coil, the at least one first conductive structure conductively coupled to the semiconductor die.

A method of fabricating a first semiconductor package is provided. The method may include: the method comprising: forming a semiconductor inductor by: depositing a first stop layer across at least a portion of a first surface of a first sacrificial substrate having a first thickness; forming a first coil having a first surface and an opposed second surface across at least a portion of the first stop layer opposite the first sacrificial substrate; depositing a passivation layer and a first dielectric layer having a thickness at least partially across the first coil; and conductively coupling at least one first conductive structure to the first coil, the at least one first conductive structure extending through the thickness of the first dielectric layer and projecting at least partially from the surface of the first dielectric layer opposite the first coil; and conductively coupling the semiconductor inductor to a semiconductor die using the at least one conductive structure.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a cross-section of an illustrative semiconductor inductor 100 in which a coil 110 is patterned or otherwise deposited on a stop layer 120 that has been deposited on a sacrificial substrate 130, such as a silicon wafer, in accordance with at least one embodiment described herein. A plurality of conductive structures 140, such as the solder balls illustrated in FIG. 1, conductively couple to the coil 110. At least one of a passivation layer and/or a dielectric layer 150 covers at least a portion of the coil 110 and surrounds the conductive structures 140.

The coil 110 may be patterned onto the stop layer 120 using any currently available or future developed deposition technique. Example deposition techniques include, but are not limited to: photolithography; electroplating; electro-less deposition; and similar. The coil 110 may have any dimensions, size, shape, or physical configuration. In embodiments, the coil 110 may be a two-dimensional coil having a plurality of concentric turns. In embodiments, the coil 110 may have only single turn. The coil 110 may have any regular physical shape, such as circular, oval, polygonal, and similar, or an irregular shape, such as trapezoidal, ovoid, and similar. The coil 110 may be fabricated from any conductive material including, but not limited to, one or more metals or metal alloys, one or more conductive polymers, or one or more conductive non-metallic materials, such as graphene.

Example metals may include, but are not limited to: copper, copper alloys, aluminum, and aluminum alloys. The conductors forming the coil may have any width and/or thickness. For example, the coil 110 may have a width of greater than: about 5 nanometers (nm); about 7 nm; about 10 nm; about 15 nm; about 20 nm; about 30 nm; about 50 nm; about 100 nm; about 250 nm; about 500 nm; about 1 μm; about 5 μm; about 10 μm.

In embodiments, the coil 110 may be formed using a metal patterning process. For example, in some embodiments, the coil 110 may be formed using a patterning process such as: depositing a metal layer on the stop layer 120; depositing a photoresist on the metal layer; applying a mask to the photoresist and exposing the photoresist to electromagnetic radiation having a defined spectral content; selectively removing portions of the photoresist; etching the metal layer to produce the coil 110; and, removing the remaining photoresist from the coil structure. In another example, the coil may be formed using a patterning process such as: sputtering a metal (e.g., TiW/Cu) on the top layer 120; depositing a photoresist on the metal layer; applying a mask to the photoresist and exposing the photoresist to electromagnetic radiation having a defined spectral content; selectively removing portions of the photoresist; etching the metal layer to produce the coil 110; electro or electroless plating the resultant structure; strip the remaining photoresist; and, etching the TiW/Cu.

The stop layer 120 may be deposited on, across, or about all or a portion of the sacrificial substrate 130. The stop layer 120 may include one or more materials, compounds, or layers capable of preventing the passage of an etchant beyond the stop layer 120. For example, the stop layer 120 may include at least one of: silicon nitride (SiN); silicon carbide (SiC); Silicon Oxide ($SiO_2$). The stop layer 120 may be deposited using any currently available or future developed deposition technique. Example deposition techniques include, but are not limited to: chemical vapor deposition, physical vapor deposition, molecular beam epitaxy; electrochemical deposition; plasma enhanced chemical vapor deposition; spin coating; and similar. The stop layer 120 may have any thickness. For example, the stop layer 120 may have a thickness of less than: about 20 nanometers (nm); about 30 nm; about 50 nm; about 70 nm; about 90 nm; or about 130 nm.

The sacrificial substrate 130 provides structural support for the coil 110 and the stop layer 120 until fabrication of the coil structure is complete and the coil 110 is coupled to an active die. The sacrificial substrate 130 beneficially provides structural support for the coil 110 prior to communicably coupling the coil 110 to an active die and may be removed from the coil 110 once the coil is coupled to the active die, thereby beneficially reducing both the weight and thickness of the resultant semiconductor package. In embodiments, the sacrificial substrate may contain silicon. In embodiments, a silicon wafer may provide the sacrificial substrate 130 and multiple coils may be formed on the wafer prior to singulation. The sacrificial substrate 130 may have any thickness. For example, the sacrificial substrate 130 may have a thickness of less than: about 800 micrometers (μm); about 700 μm; about 600 μm; about 500 μm; about 400 μm; about 300 μm; or about 200 μm. Where a silicon wafer is used to provide the sacrificial substrate 130, the silicon wafer may have a diameter of: about 450 millimeter (mm); about 300 mm; about 200 mm; about 150 mm; about 130 mm; about 100 mm; about 76 mm; about 50 mm; or about 25 mm.

The conductive structures 140 may include any device or feature capable of conductively coupling the inductor 100 to an external system, such as an active die. Any number and/or combination of conductive structure 140 may be used to communicably couple the coil 110 to an external device or system, such as an active die. The conductive structures 140 may include any currently available or future developed device and/or system capable of conductively coupling the inductor 100 to an external device or system. The conductive structures 140 may physically affix the inductor 100 to an external device or system. In some implementations, the conductive structures 140 may include one or more solder balls. In some implementations, the conductive structures 140 may include one or more conductive pillars. In some implementations, the conductive structures 140 may include solder bumps.

The dielectric layer 150 is disposed on, across, or about the coil 110 and on, across, or about the stop layer 120. In embodiments, the dielectric layer 150 encapsulates the coil 110 and at least partially encapsulates the conductive structures 140. In embodiments, at least a portion of the conductive structures 140 may extend or project beyond the surface of the dielectric layer 150 opposite the coil 110. The dielectric layer may include one or more electrically insulating materials. Example dielectric materials include, but are not limited to: nanoporous silica; hydrogensilsesquioxanes (HSQ); Teflon®-AF (polytetrafluoethylene or PTFE); silicon oxyflouride (FSG); silicon dioxide ($SiO_2$); silicon nitride; alkali halides; barium titanate ($BaTiO_3$); hafnium oxide ($HfO_2$); tantalum oxide ($TaO_5$); tungsten oxide ($WO_3$); zirconium oxide ($ZrO_2$); and similar.

Figure 2A:
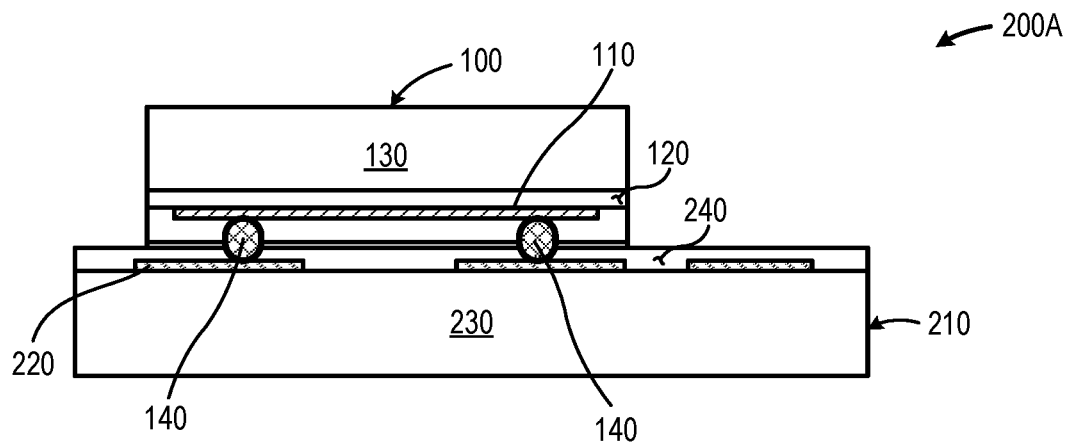
FIG. 2A is a cross-section of an illustrative system that includes a semiconductor inductor communicably coupled to an active die that includes a number of conductors or conductive pads disposed on, about, or across a surface of a substrate, a dielectric layer at least partially covers the conductors and the substrate, in accordance with at least one embodiment described herein.

FIG. 2A is a cross-section of an illustrative system 200A that includes a semiconductor inductor 100 communicably coupled to an active die 210 that includes a number of conductors or conductive pads 220 disposed on, about, or across a surface of a substrate 230, a dielectric layer 240 at least partially covers the conductors 220 and the substrate 230, in accordance with at least one embodiment described herein. It should be noted that the embodiments described in FIGS. 2A through 2E may be performed at the wafer level, i.e., prior to die singulation.

In embodiments, the semiconductor inductor 100 may be inverted (such that the conductive structures 140 extend from the "bottom" of the semiconductor inductor 100. The conductive structures 140 may contact and be physically and conductively coupled to the same or a different number of conductors 220 disposed on the surface of the active die 210. The dielectric layer 240 may be disposed at least partially about the conductive structures 140 and conductors 220. In embodiments, the dielectric layer 240 may electrically isolate the semiconductor inductor 100 from the active die 210.

The active die 210 may include any type or number of electrical components, semiconductor devices, and/or logic elements. The active die 210 may include one or more processors, microprocessor, controllers, microcontrollers, programmable gate arrays (PGAs), systems on a chip (SoCs), reduced instruction set computers (RISCs), application specific integrated circuits (ASICs), digital signal processors (DSPs), central processing units (CPUs), graphical processing units (GPUs), and similar. In embodiments, the active die 210 may include one or more mobile device processors, communications interfaces, such as: IEEE 802.11 (Wi-Fi); Bluetooth®, Near Field Communication (NFC), or combinations thereof.

Figure 2B:
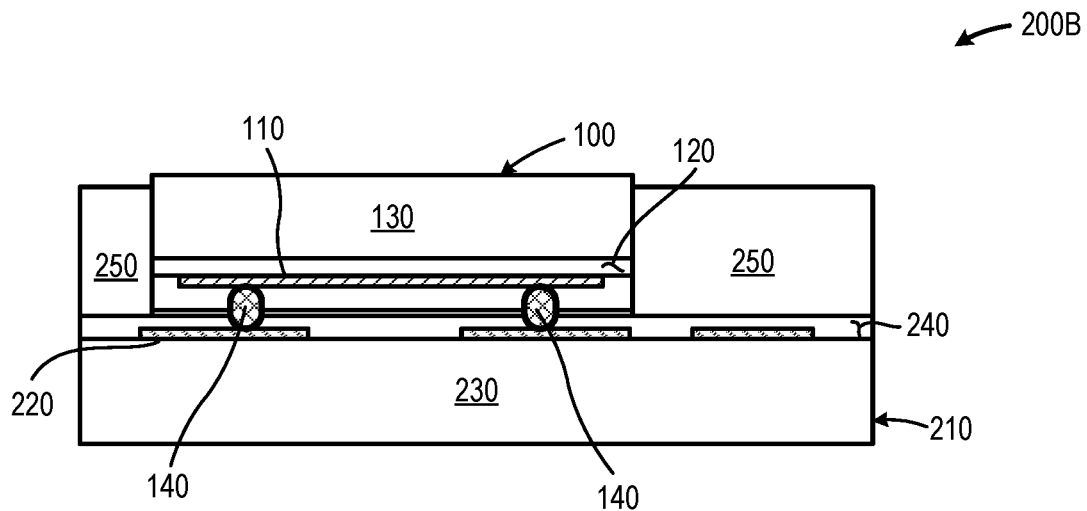
FIG. 2B is a cross section of an illustrative system that includes the semiconductor inductor and the active die depicted in FIG. 2A and in which a mold compound has been disposed on, across, or about the active die and about at least a portion of the perimeter of the semiconductor inductor, in accordance with at least one embodiment described herein.

FIG. 2B is a cross section of an illustrative system 200B that includes the semiconductor inductor 100 and the active die 210 depicted in FIG. 2A and in which a mold compound 250 has been disposed on, across, or about the active die 210 and about at least a portion of the perimeter of the semiconductor inductor 100, in accordance with at least one embodiment described herein. The mold compound 250 may include any electrically non-conductive material, compound, or substance capable of protecting the active die 210. Example mold compounds include, but are not limited to: elastomers, such as silicone, polyurethane, chloroprene, butyl, polybutadiene, neoprene, natural rubber or isoprene, and other synthetic rubber or compounds; composite compounds that include resins made from two or more constituent materials with significantly different physical or chemical properties; thermoplastics that include polymers that turn to liquid when heated and turn solid when cooled; thermosets that include polymer materials that have been irreversibly cured; and silicone molding compounds. The upper surface of the mold compound 250 opposite the active die may be lower, higher, or the same elevation as the upper surface of the sacrificial substrate 130 opposite the stop layer 120.

Figure 2C:
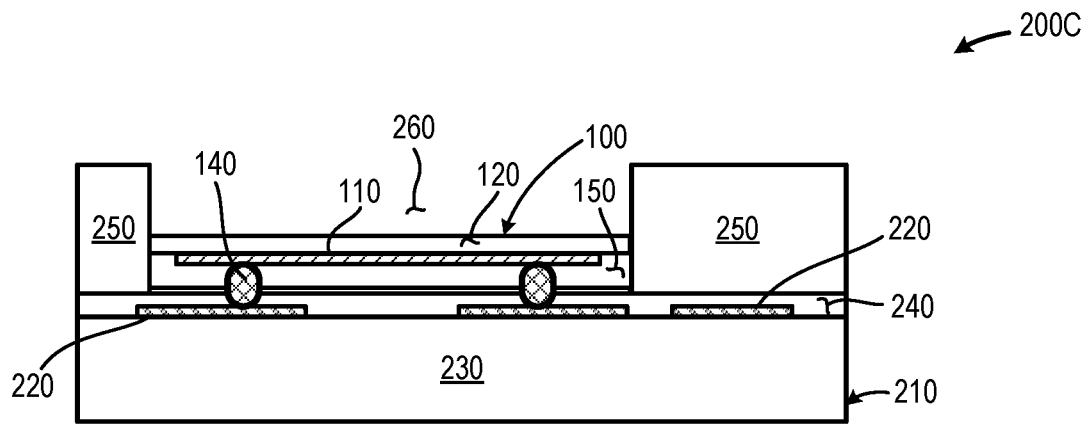
FIG. 2C is a cross-section of an illustrative system that includes the semiconductor inductor and the active die depicted in FIG. 2A and in which at least a portion of the sacrificial substrate has been removed from the semiconductor inductor to provide a void proximate the semiconductor inductor while the mold compound remains unaffected, in accordance with at least one embodiment described herein.

FIG. 2C is a cross-section of an illustrative system 200C that includes the semiconductor inductor 100 and the active die 210 depicted in FIG. 2A and in which at least a portion of the sacrificial substrate 130 has been removed from the semiconductor inductor 100 to provide a void 260 proximate the semiconductor inductor 100 while the mold compound 250 remains unaffected, in accordance with at least one embodiment described herein. All or a portion of the thickness of the sacrificial substrate 130 may be removed using one or more material removal systems, processes, or devices to form the void 260 proximate the semiconductor inductor 100. For example, all or a portion of the thickness of the sacrificial substrate 130 may be removed using wet chemistry on a spin etcher. The etching process may halt upon reaching the stop layer 120. The mold compound 250 remains unaffected by the etching process.

Figure 2D:
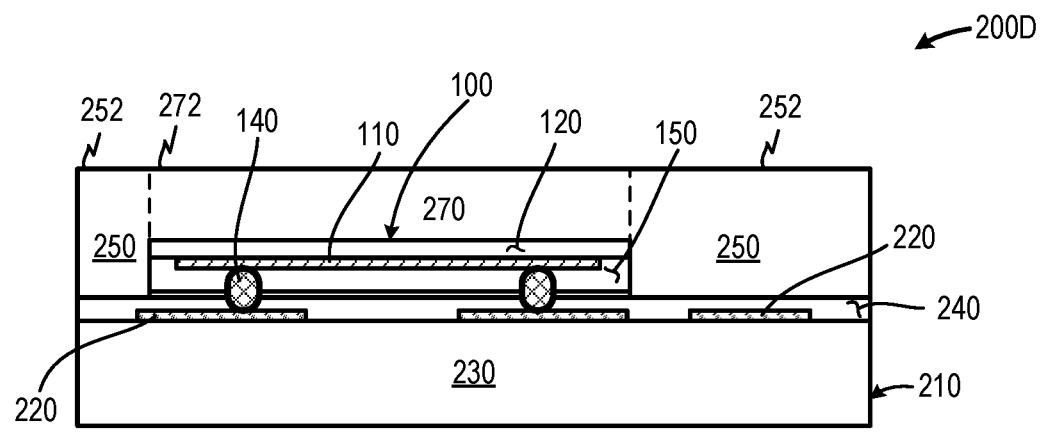
FIG. 2D is a cross-section of an illustrative system that includes the semiconductor inductor and the active die depicted in FIG. 2A and in which mold compound has been deposited in the void space formed by the removal of the sacrificial substrate, in accordance with at least one embodiment described herein.

FIG. 2D is a cross-section of an illustrative system 200D that includes the semiconductor inductor 100 and the active die 210 depicted in FIG. 2A and in which mold compound 270 has been deposited in the void space 260 formed by the removal of the sacrificial substrate 130, in accordance with at least one embodiment described herein. The mold compound 270 may be the same as or different from the mold compound 250 previously deposited on, about, or across the active die 210. In embodiments, the upper surface 272 of mold compound 270 may be above, below, or at the same elevation as the upper surface 252 of mold compound 250. In some implementations, after deposition of mold compound 270, the upper surface 272 of mold compound and the upper surface 252 of mold compound 250 may be mechanically planarized, chemically planarized, or any combination thereof. In some implementations, the upper surface 272 of mold compound 270 and the upper surface 252 of mold compound 250 may be finished using one or more chemical-mechanical planarization (CMP) processes.

Figure 2E:
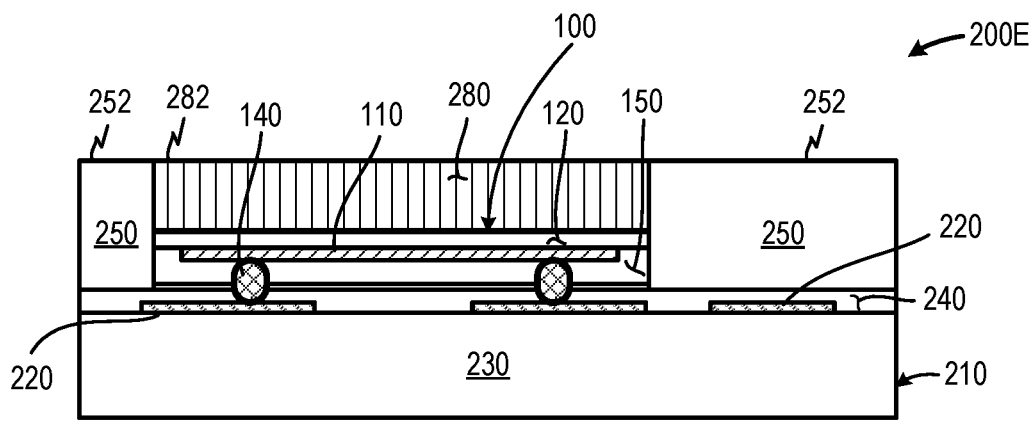
FIG. 2E is a cross-section of an illustrative system that includes the semiconductor inductor and the active die depicted in FIG. 2A and in which a magnetic material has been deposited in the void space formed by the removal of the sacrificial substrate, in accordance with at least one embodiment described herein.

FIG. 2E is a cross-section of an illustrative system 200E that includes the semiconductor inductor 100 and the active die 210 depicted in FIG. 2A and in which a magnetic material 280 has been deposited in the void space 260 formed by the removal of the sacrificial substrate 130, in accordance with at least one embodiment described herein. In embodiments, the upper surface 282 of the magnetic material 280 may be above, below, or at the same elevation as the upper surface 252 of mold compound 250. In some implementations, after deposition of the magnetic material 280, the upper surface 282 of the magnetic material 280 and the upper surface 252 of mold compound 250 may be mechanically planarized, chemically planarized, or any combination thereof. In some implementations, the upper surface 282 of the magnetic material 280 and the upper surface 252 of mold compound 250 may be finished using one or more chemical-mechanical planarization (CMP) processes.

The magnetic material 280 improves the inductive performance of the semiconductor inductor 100. The magnetic material 280 may include one or more non-electrically conductive materials demonstrating magnetic properties. Example magnetic materials may include one or more soft magnetic composite materials, such as one or more ferritic materials encapsulated in a non-electrically conductive material or polymer). The backside of the setup can be finally cover by a protection layer, e.g. backside protection tape (BSP).

Figure 3A:
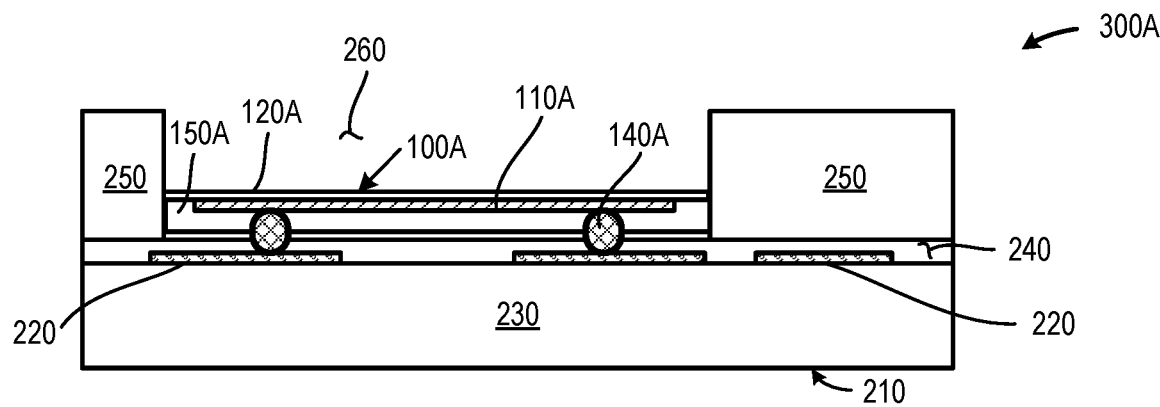
FIG. 3A is a cross-section of an illustrative three-dimensional semiconductor inductor system that includes a first semiconductor inductor with the sacrificial substrate removed, communicably coupled to an active die, in accordance with at least one embodiment described herein.

FIG. 3A is a cross-section of an illustrative three-dimensional semiconductor inductor system 300A that includes a first semiconductor inductor 110A with the sacrificial substrate 130A removed, communicably coupled to an active die 210, in accordance with at least one embodiment described herein. As depicted in FIG. 3A, a first semiconductor inductor 110A is physically and communicably coupled to the active die 210 by a plurality of conductive structures 140A. The active die 210 has been covered with a mold compound 250 and the sacrificial substrate 130A has been removed from the semiconductor inductor 110A, leaving a void space 260 above the semiconductor inductor 110A.

Figure 3B:
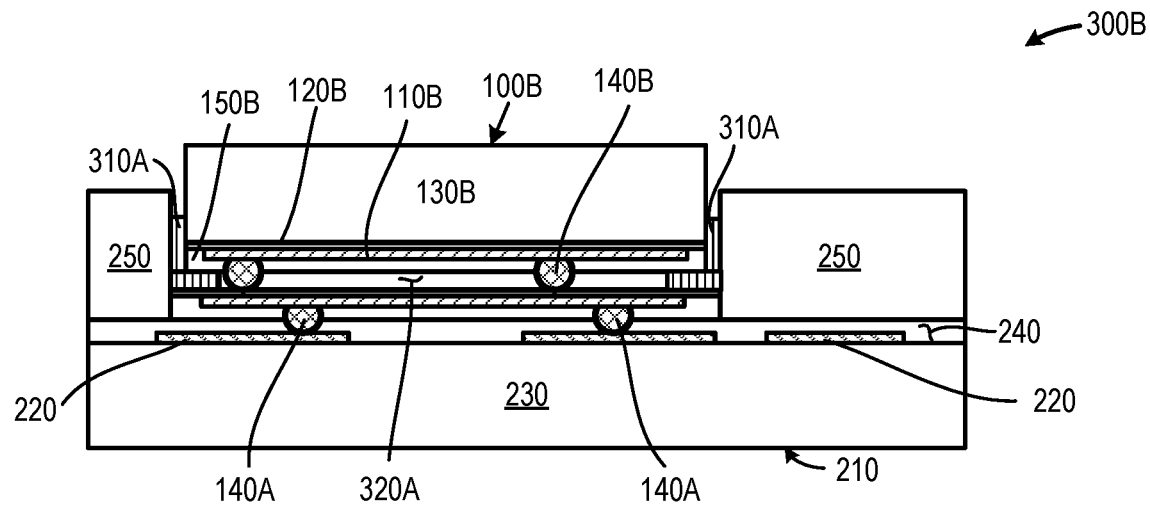
FIG. 3B is a cross-section of an illustrative three-dimensional semiconductor inductor system in which a second semiconductor inductor has been communicably coupled to the first semiconductor inductor depicted in FIG. 3A, in accordance with at least one embodiment described herein.

FIG. 3B is a cross-section of an illustrative three-dimensional semiconductor inductor system 300B in which a second semiconductor inductor 100B has been communicably coupled to the first semiconductor inductor 100A depicted in FIG. 3A, in accordance with at least one embodiment described herein. As depicted in FIG. 3B, removal of at least a portion of the first stop layer 120A exposes the first semiconductor inductor coil 110A. In embodiments, portions of the first stop layer 120A may be selectively removed using one or more laser material removal processes or using one or more lithographic and reactive ion etching processes. In other embodiments, although not depicted in FIG. 3B, the first stop layer 120A may be removed in its entirety. For example, the first stop layer 120A may be completely removed using one or more plasma etch processes.

After the partial or complete removal of the first stop layer 120, the second semiconductor inductor 100B may be physically and communicably coupled to the first semiconductor inductor 100A using second conductive structures 140B. A first etch seal 310A may be added about all or a portion of the periphery of the second semiconductor inductor 100B. A first gap 320A may exist between the first semiconductor inductor 100A and the second semiconductor inductor 100B. Although not depicted in FIG. 3B, in some implementations, one or more non-electrically conductive underfill materials may be used to at least partially fill the first gap 320A between the first semiconductor inductor 100A and the second semiconductor inductor 100B.

Figure 3C:
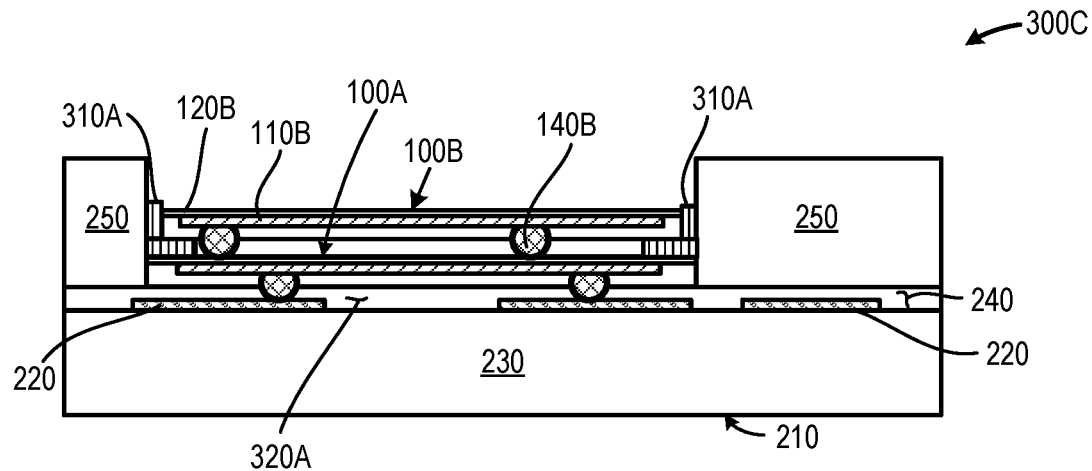
FIG. 3C is a cross-section of an illustrative stacked, three-dimensional, semiconductor inductor system in which the second sacrificial substrate has been removed from the second semiconductor inductor, in accordance with at least one embodiment described herein.

FIG. 3C is a cross-section of an illustrative stacked, three-dimensional, semiconductor inductor system 300C in which the second sacrificial substrate 130B has been removed from the second semiconductor inductor 100B, in accordance with at least one embodiment described herein. All or a portion of the thickness of the second sacrificial substrate 130B may be removed using one or more material removal systems, processes, or devices. For example, all or a portion of the thickness of the second sacrificial substrate 130B may be removed using wet chemistry on a spin etcher. The etching process may halt upon reaching the second stop layer 120B. The mold compound 250 remains unaffected by the wet chemistry etching process. The presence of the first etch stop 310A prevents the wet etch process from entering the first gap 320A and affecting the underlying first semiconductor inductor 100A.

Figure 3D:
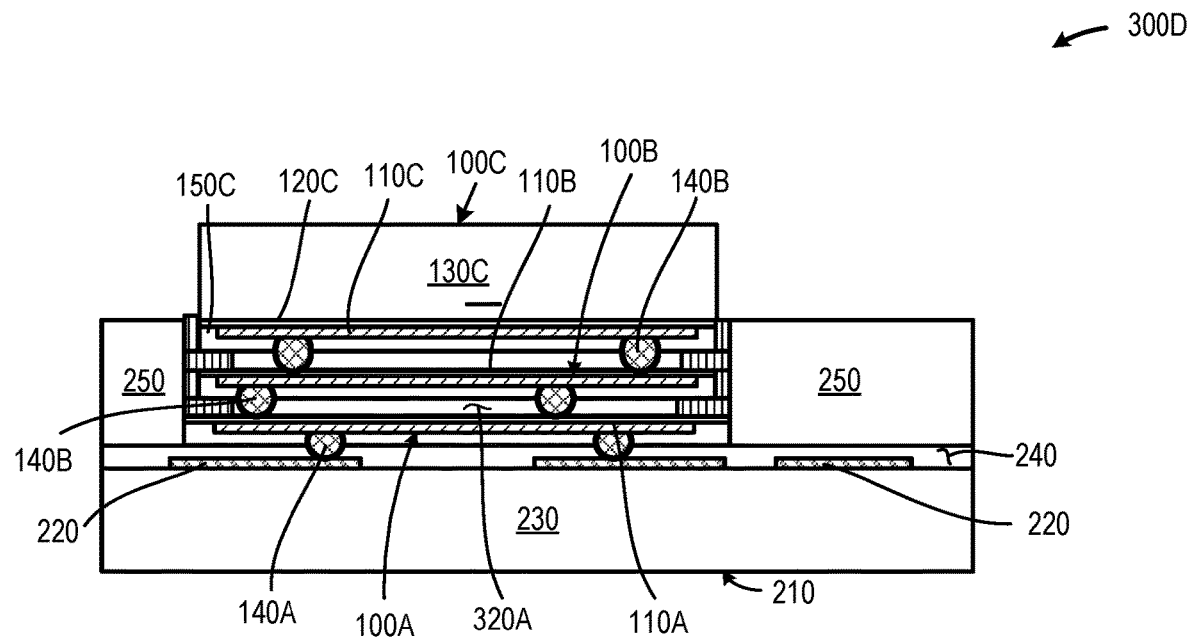
FIG. 3D is a cross-section of an illustrative stacked, three-dimensional, semiconductor inductor system in which a third semiconductor inductor has been communicably coupled to the second semiconductor inductor depicted in FIG. 3C, in accordance with at least one embodiment described herein.

FIG. 3D is a cross-section of an illustrative stacked, three-dimensional, semiconductor inductor system 300D in which a third semiconductor inductor 100C has been communicably coupled to the second semiconductor inductor 100B depicted in FIG. 3C, in accordance with at least one embodiment described herein. As depicted in FIG. 3D, removal of at least a portion of the second stop layer 120B exposes at least a portion of the second coil 110B. In embodiments, portions of the second stop layer 120B may be selectively removed using one or more laser material removal processes or using one or more lithographic and reactive ion etching processes. In other embodiments, although not depicted in FIG. 3D, the second stop layer 120B may be completely removed. For example, the second stop layer 120B may be completely removed using one or more plasma etch processes.

After the partial or complete removal of the second stop layer 120B, the third semiconductor inductor 100C may be physically and communicably coupled to the second semiconductor inductor 100B using the third conductive structures 140C. A second etch seal 310B may be added about all or a portion of the periphery of the third semiconductor inductor 100C. A second gap 320B may exist between the second semiconductor inductor 100B and the third semiconductor inductor 100C. Although not depicted in FIG. 3D, in some implementations, one or more non-electrically conductive underfill materials may be used to at least partially fill the second gap 320B between the second semiconductor inductor 100B and the third semiconductor inductor 100C.

Figure 3E:
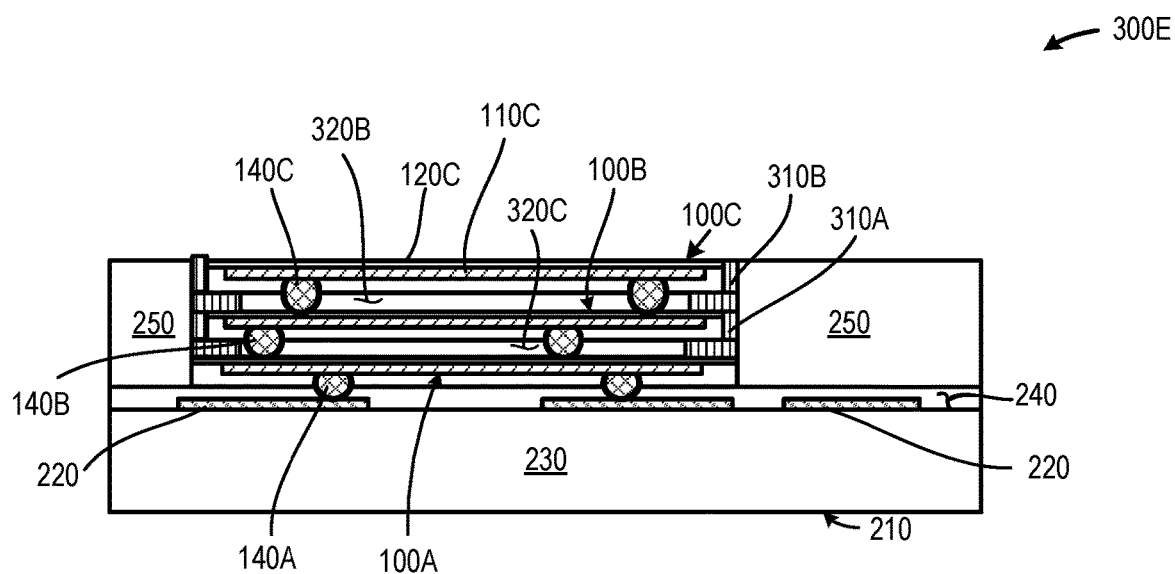
FIG. 3E is a cross-section of an illustrative stacked, three-dimensional, semiconductor inductor system in which the third sacrificial substrate has been removed from the third semiconductor inductor, in accordance with at least one embodiment described herein.

FIG. 3E is a cross-section of an illustrative stacked, three-dimensional, semiconductor inductor system 300E in which the third sacrificial substrate 130C has been removed from the third semiconductor inductor 100C, in accordance with at least one embodiment described herein. All or a portion of the thickness of the third sacrificial substrate 130C may be removed using one or more material removal systems, processes, or devices. For example, all or a portion of the thickness of the third sacrificial substrate 130C may be removed using wet chemistry on a spin etcher. The etching process may halt upon reaching the third stop layer 120C. The mold compound 250 remains unaffected by the wet chemistry etching process. The presence of the second etch stop 310B prevents the wet etch process from entering the second gap 320B and affecting the underlying second semiconductor inductor 100B.

Figure 4A:
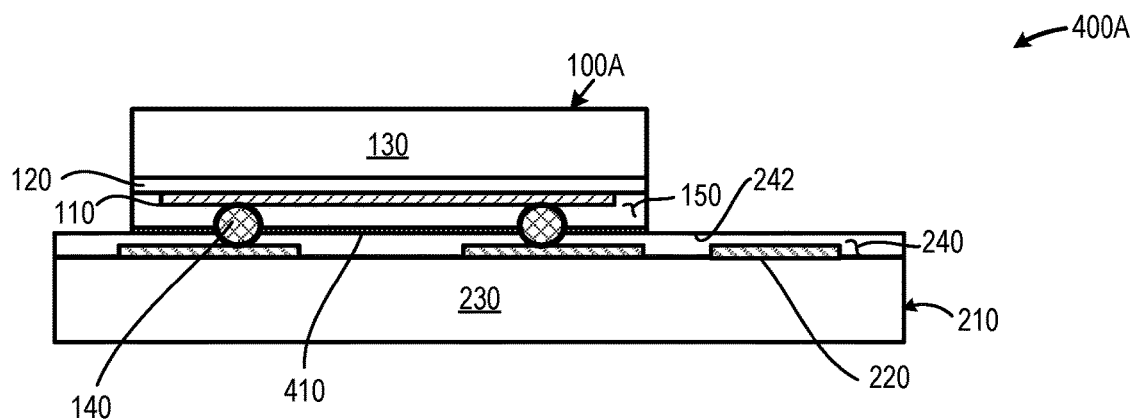
FIG. 4A is a cross-section of an illustrative semiconductor inductor system that includes a first semiconductor inductor, communicably coupled to an active die, in accordance with at least one embodiment described herein.

FIG. 4A is a cross-section of an illustrative semiconductor inductor system 400A that includes a first semiconductor inductor 100A, communicably coupled to an active die 210, in accordance with at least one embodiment described herein. As depicted in FIG. 4A, a first semiconductor inductor 100A is physically and communicably coupled to the active die 210 by a plurality of conductive structures 140A. In some implementations, an electrically non-conductive material or filler 410 may be disposed at least partially beneath the first semiconductor inductor 100A. In some implementations, the electrically non-conductive material or filler 410 may physically bond or adhere the first semiconductor inductor 100A to the active die 210.

In embodiments, rather than using a mold compound 250 to encapsulate and protect the active die 210 as discussed in detail in FIGS. 3A-3E, a removable etch resist may be used to encapsulate and protect the active die 210. The use of a removable etch resist compound would permit re-exposing the active die 210 after the conductive coupling of one or more semiconductor inductors 100 to the active die 210. Such a construction would beneficially facilitate the attachment of solder balls or similar conductive structures to the exposed surface 242 of the active die 210 to provide a wafer level package.

Figure 4B:
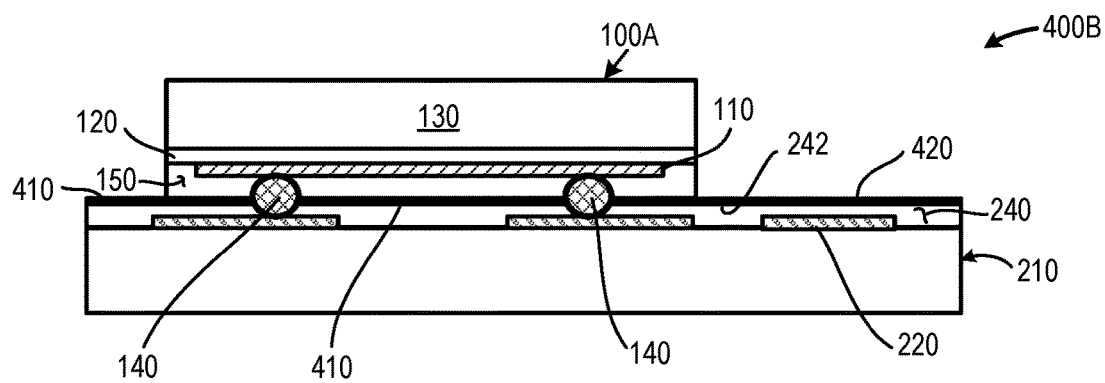
FIG. 4B is a cross-section of the illustrative semiconductor inductor system that includes the first semiconductor inductor, communicably coupled to an active die as depicted in FIG. 4A, and in which a stop layer has been deposited on, across, or about at least a portion of the surface of the active die, in accordance with at least one embodiment described herein.

FIG. 4B is a cross-section of the illustrative semiconductor inductor system 400B that includes the first semiconductor inductor 100A, communicably coupled to an active die 210 as depicted in FIG. 4A, and in which a stop layer 420 has been deposited on, across, or about at least a portion of the surface of the active die 210, in accordance with at least one embodiment described herein. In embodiments, the stop layer 420 may include a layer that includes carbon or one or more carbon containing compounds. In embodiments, the stop layer 420 may extend across all or a portion of the surface 242 of the active die 210, but may not extend beneath the first semiconductor inductor 100A. In other embodiments, the stop layer 420 may extend across all or a portion of the surface 242 of the active die 210 and at least partially beneath the first semiconductor inductor 100A.

Figure 4C:
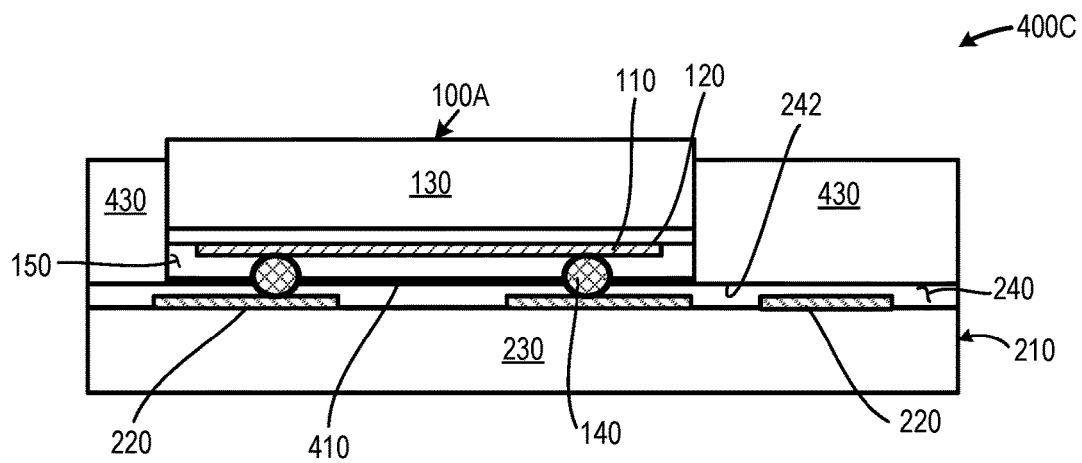
FIG. 4C is a cross-section of the illustrative semiconductor inductor system that includes the first semiconductor inductor, communicably coupled to the active die as depicted in FIG. 4B, and in which a removable etch resist has been deposited on, about, or across at least a portion of the exposed surface the active die, in accordance with at least one embodiment described herein.

FIG. 4C is a cross-section of the illustrative semiconductor inductor system 400C that includes the first semiconductor inductor 100A, communicably coupled to the active die 210 as depicted in FIG. 4B, and in which a removable etch resist 430 has been deposited on, about, or across at least a portion of the exposed surface 242 the active die 210, in accordance with at least one embodiment described herein. In embodiments, the removable etch resist 430 may include any compound that provides sufficient resistance to the wet chemistry used to remove the sacrificial substrate 130 from the first semiconductor inductor 100A, but remains removable to permit additional processing of the active die after the assembly of the first semiconductor inductor 100A to the active die 210. In some implementations, the removable etch resist 430 may include one or more photosensitive removable etch resist compounds.

Figure 4D:
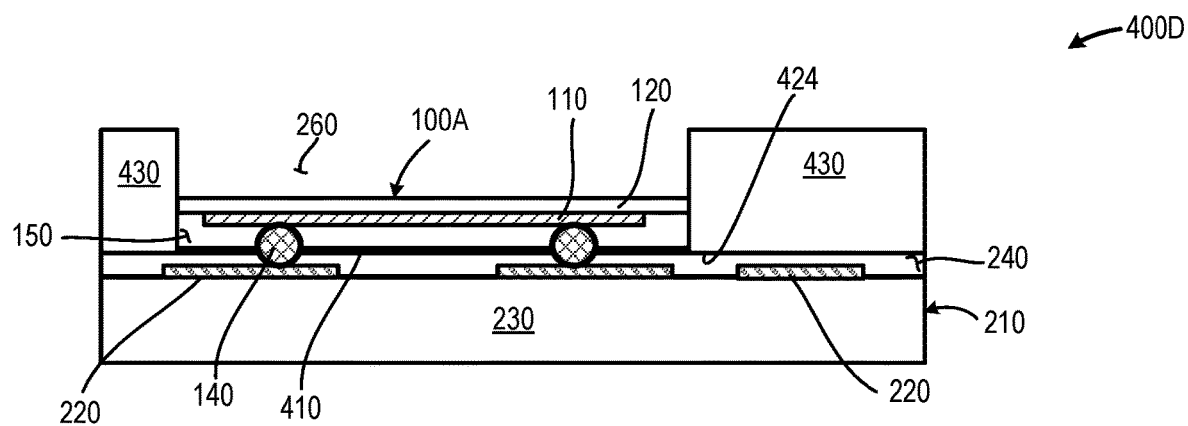
FIG. 4D is a cross-section of the illustrative semiconductor inductor system that includes the first semiconductor inductor, communicably coupled to the active die depicted in FIG. 4C and in which at least a portion of the sacrificial substrate has been removed from the first semiconductor inductor to provide a void proximate the first semiconductor inductor while the removable etch resist remains unaffected, in accordance with at least one embodiment described herein.

FIG. 4D is a cross-section of the illustrative semiconductor inductor system 400D that includes the first semiconductor inductor 100A, communicably coupled to the active die 210 depicted in FIG. 4C and in which at least a portion of the sacrificial substrate 130 has been removed from the first semiconductor inductor 100A to provide a void 260 proximate the first semiconductor inductor 100A while the removable etch resist 430 remains unaffected, in accordance with at least one embodiment described herein. All or a portion of the thickness of the sacrificial substrate 130 may be removed using one or more material removal systems, processes, or devices to form the void 260 proximate the first semiconductor inductor 100A. For example, all or a portion of the thickness of the sacrificial substrate 130 may be removed using wet chemistry on a spin etcher. The etching process may halt upon reaching the stop layer 120. The removable etch resist 430 remains unaffected by the wet chemistry etching process.

Figure 4E:
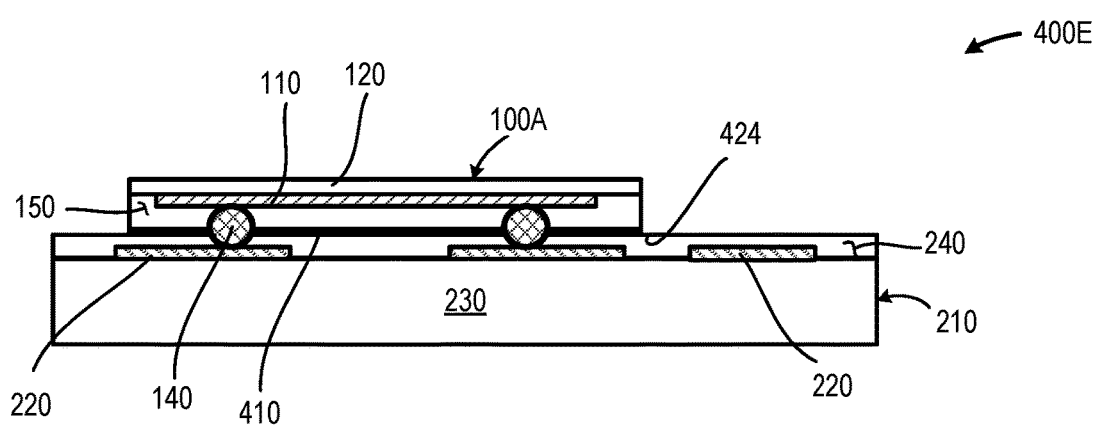
FIG. 4E is a cross-section of the illustrative semiconductor inductor system that includes the first semiconductor inductor, communicably coupled to the active die depicted in FIG. 4D and in which at least a portion of the removable etch resist has been removed to expose at least a portion of the exposed surface of the active die, in accordance with at least one embodiment described herein.

FIG. 4E is a cross-section of the illustrative semiconductor inductor system 400E that includes the first semiconductor inductor 100A, communicably coupled to the active die 210 depicted in FIG. 4D and in which at least a portion of the removable etch resist 430 has been removed to expose at least a portion of the exposed surface 242 of the active die 210, in accordance with at least one embodiment described herein. The removable etch resist 430 may be partially or completely removed using any currently available or future developed removal process that does not affect the performance of the stop layer 120 on the first semiconductor inductor 100A. In embodiments, the removable etch resist 430 may be removed via one or more plasma etching processes or wet chemistry etching processes. In embodiments, exposing the surface 242 of the active die 210 beneficially facilitates the attachment of solder balls or similar conductive structures to the exposed surface 242 of the active die 210 to provide a wafer level package.

Figure 4F:
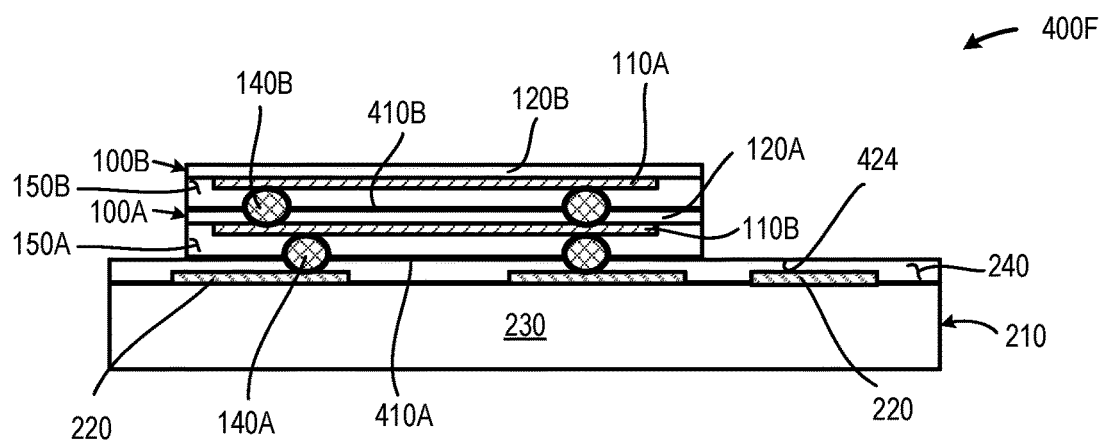
FIG. 4F is a cross-section of the illustrative semiconductor inductor system that includes the first semiconductor inductor and a conductively coupled second semiconductor inductor coupled to an active die, in accordance with at least one embodiment described herein.

FIG. 4F is a cross-section of the illustrative semiconductor inductor system 400F that includes the first semiconductor inductor 100A and a conductively coupled second semiconductor inductor 100B coupled to an active die 210, in accordance with at least one embodiment described herein. Prior to removal of the removable etch resist 430, any number of additional semiconductor inductors 100B-100n may be conductively coupled to the active die to provide a stacked, three-dimensional semiconductor inductor. Any number of semiconductor inductors 100A-100n may stacked by: etching the stop layer 120 of the uppermost semiconductor inductor, conductively coupling the next semiconductor inductor to the upper most semiconductor inductor using one or more conductive structures 140, and removing the sacrificial substrate 130 from the newly added semiconductor inductor.

Figure 5A:
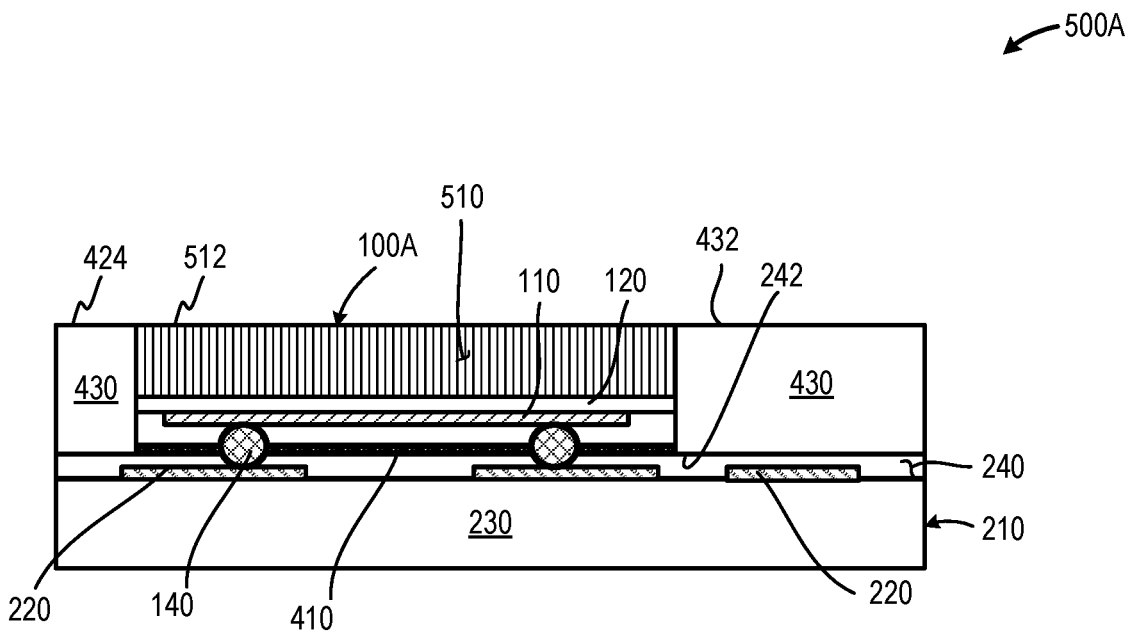
FIG. 5A is a cross-section of an illustrative semiconductor inductor system that includes a semiconductor inductor having the sacrificial substrate removed and replaced with a magnetic material, in accordance with at least one embodiment described herein.

FIG. 5A is a cross-section of an illustrative semiconductor inductor system 500A that includes a semiconductor inductor 100 having the sacrificial substrate 130 removed and replaced with a magnetic material 510, in accordance with at least one embodiment described herein. The semiconductor inductor 100 conductively couples to an active die 210 having a removable etch resist 430 disposed on, about, or across at least a portion of the exposed surface 242 of the active die 210. In embodiments, the upper surface 512 of the magnetic material 510 may be above, below, or at the same elevation as the upper surface 432 of the removable etch resist 430. The magnetic material 510 improves the inductive performance of the semiconductor inductor 100. The magnetic material 510 may include one or more non-electrically conductive materials demonstrating magnetic properties. Example magnetic materials may include one or more soft magnetic composite materials, such as one or more ferritic materials encapsulated in a non-electrically conductive material or polymer).

Figure 5B:
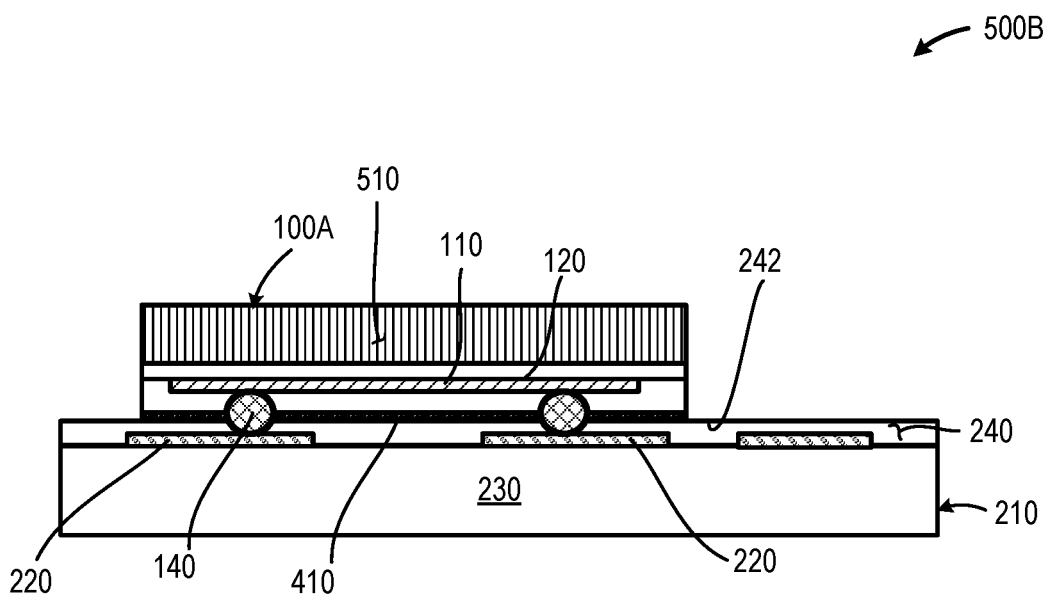
FIG. 5B is a cross-sectional elevation of an illustrative semiconductor inductor system that includes the semiconductor inductor that includes a magnetic material disposed proximate the stop layer, communicably coupled to the active die in which at least a portion of the removable etch resist has been removed to expose at least a portion of the exposed surface of the active die, in accordance with at least one embodiment described herein.

FIG. 5B is a cross-sectional elevation of an illustrative semiconductor inductor system 500B that includes the semiconductor inductor 100 that includes a magnetic material 510 disposed proximate the stop layer 120, communicably coupled to the active die 210 in which at least a portion of the removable etch resist 430 has been removed to expose at least a portion of the exposed surface 242 of the active die 210, in accordance with at least one embodiment described herein. The removable etch resist 430 may be partially or completely removed using any currently available or future developed removal process that does not affect the performance of the stop layer 120 on the semiconductor inductor 100. In embodiments, the removable etch resist 430 may be removed via one or more plasma etching processes or wet chemistry etching processes. In embodiments, exposing the surface 242 of the active die 210 beneficially facilitates the attachment of solder balls or similar conductive structures to the exposed surface 242 of the active die 210 to provide a wafer level package.

Figure 6:
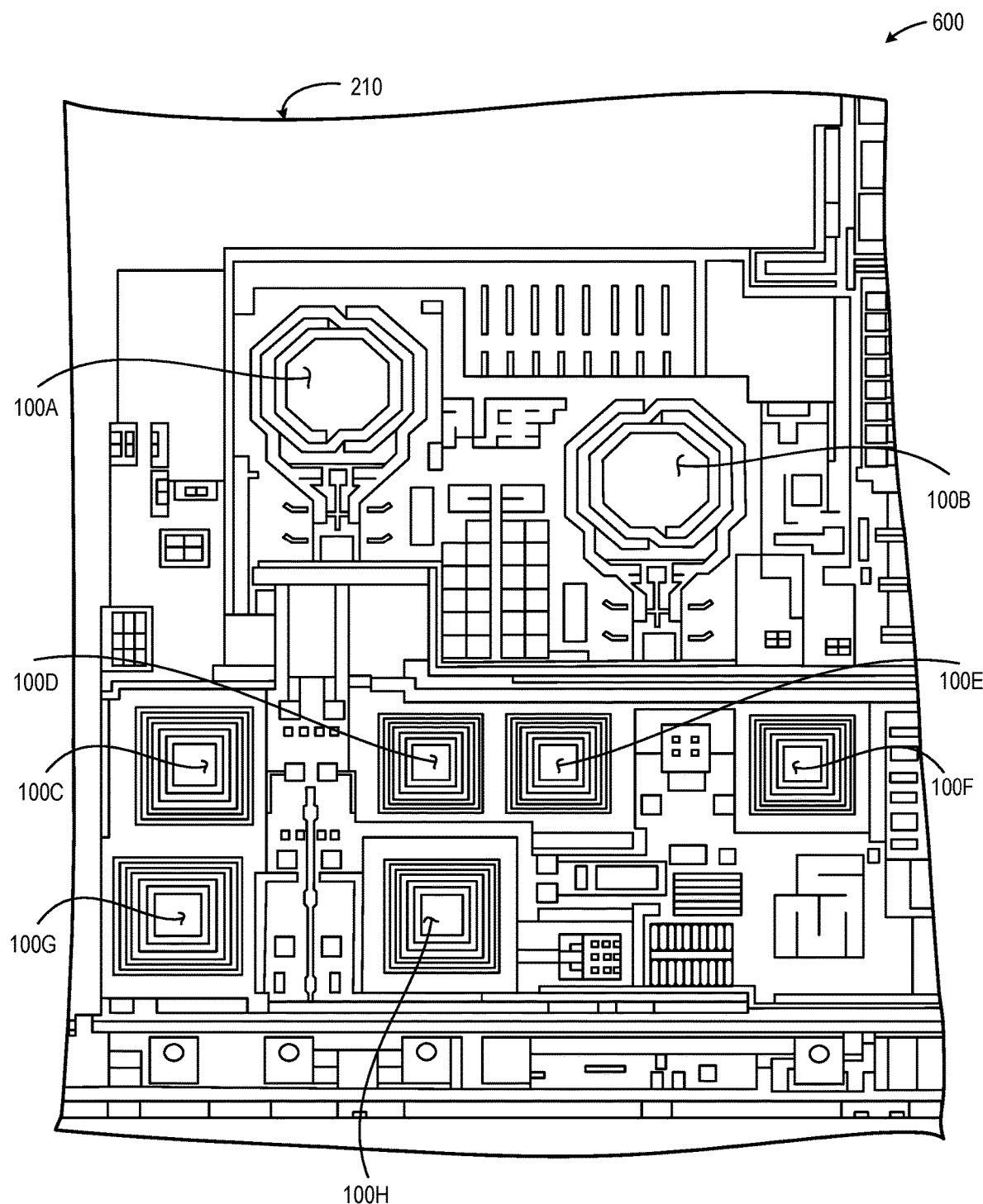
FIG. 6 is a plan view of an illustrative system that includes a plurality of semiconductor inductors, in accordance with at least one embodiment described herein.

FIG. 6 is a plan view of an illustrative system 600 that includes a plurality of semiconductor inductors 100A-100H, in accordance with at least one embodiment described herein. Each of the semiconductor inductors 100A-100H includes a plurality of windings disposed across the surface of the active die 210.

Figure 7:
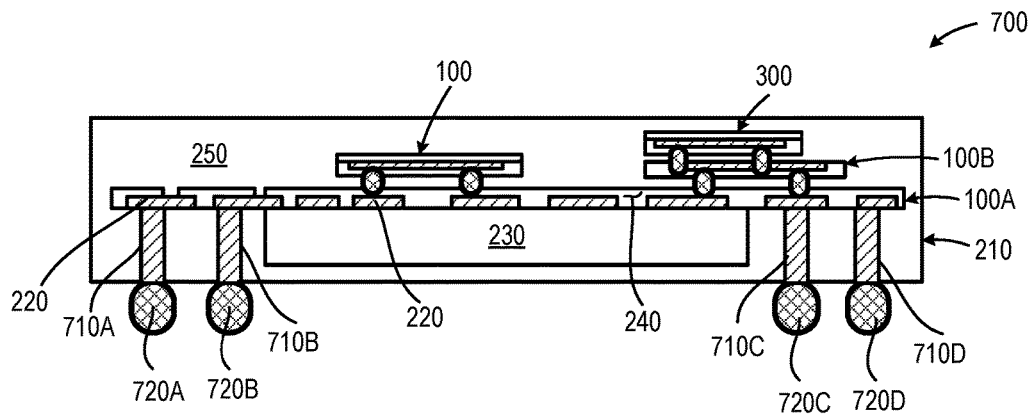
FIG. 7 is a cross-sectional elevation of an illustrative embedded wafer level ball grid array (eWLB) semiconductor package using through mold vias (TMVs) and including a number of semiconductor inductors such as described in detail with regard to FIGS. 1-6, in accordance with at least one embodiment described herein.

FIG. 7 is a cross-sectional elevation of an illustrative embedded wafer level ball grid array (eWLB) semiconductor package 700 using through mold vias (TMVs) 710A-710D (collectively, "TMVs 710") and including a number of semiconductor inductors such as described in detail with regard to FIGS. 1-6, in accordance with at least one embodiment described herein. As depicted in FIG. 7, the TMVs 710 conductively couple the pads 220 on the active die 230 to an exposed ball grid array that includes a number of solder balls 720A-720D on the package bottom. In embodiments, a redistribution layer (RDL) may provide all or a portion of the pads 220. The semiconductor package 700 includes a single coil semiconductor inductor 100 and a stacked coil semiconductor inductor 300 that includes a first semiconductor inductor 100A and a second semiconductor inductor 100B. The single coil semiconductor inductor 100 and the stacked coil semiconductor inductor 300 conductively couple to the upper surface of the active die 230. The active die 230, the semiconductor inductor 100 and the stacked semiconductor inductor 300 are encapsulated in mold compound 250 to provide the eWLB semiconductor package 700. Although only two semiconductor inductors 100 and 300 are depicted in FIG. 7, any number of semiconductor inductors 100 and/or stacked semiconductor inductors 300 may be similarly coupled to the active die 230.

Figure 8:
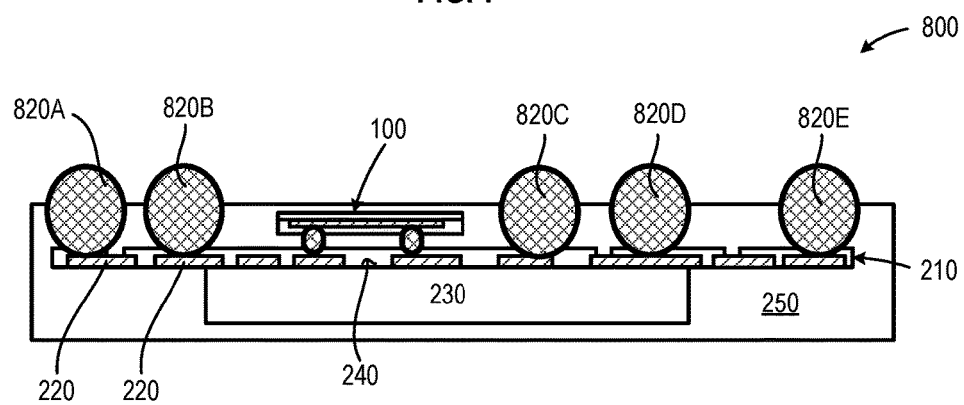
FIG. 8 is a cross-sectional elevation of another illustrative embedded wafer level ball grid array (eWLB) semiconductor package in which both the solder balls forming the ball grid array and the semiconductor inductor are disposed on the upper surface of the active die, in accordance with at least one embodiment described herein.

FIG. 8 is a cross-sectional elevation of another illustrative embedded wafer level ball grid array (eWLB) semiconductor package 800 in which both the solder balls 820A-820E forming the ball grid array and the semiconductor inductor 100 are disposed on the upper surface of the active die 230, in accordance with at least one embodiment described herein. In embodiments, the active die 230 and the semiconductor inductor 100 may be encapsulated in mold compound 250. In such embodiments, the pads 220 on the upper surface of the active die 230 may be opened, for example using one or more laser ablation or other similar selective material removal processes, and the solder balls 820 inserted to conductively couple the eWLB semiconductor package 800 to an external device. Although only a single semiconductor inductor 100 is depicted in FIG. 8, any number of semiconductor inductors 100 may be similarly coupled to the active die 230.

Figure 9:
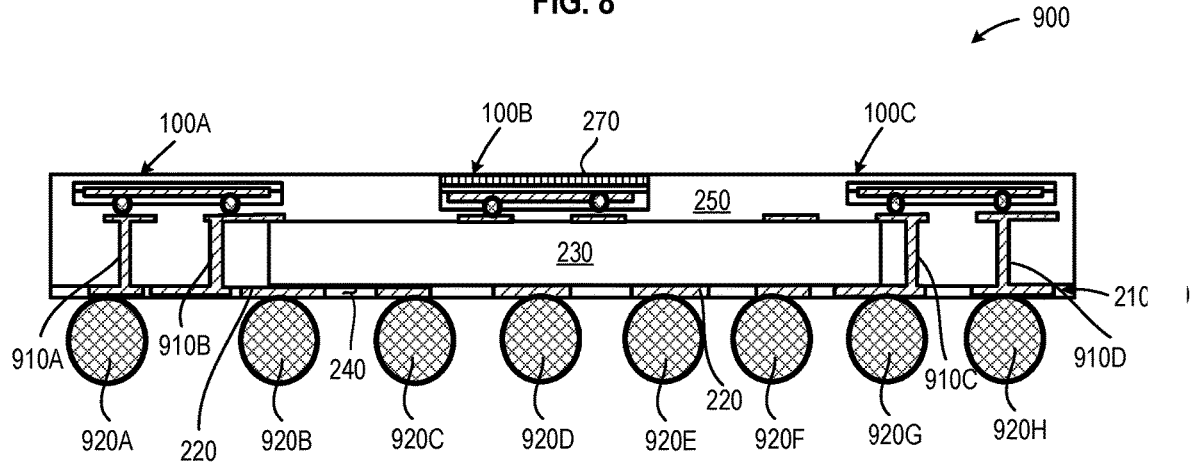
FIG. 9 is a cross-sectional elevation of another illustrative embedded wafer level ball grid array (eWLB) semiconductor package using through mold vias (TMVs) and back-side metallization, in accordance with at least one embodiment described herein.

FIG. 9 is a cross-sectional elevation of another illustrative embedded wafer level ball grid array (eWLB) semiconductor package 900 using through mold vias (TMVs) 910A-910D (collectively, "TMVs 910") and back-side metallization, in accordance with at least one embodiment described herein. The eWLB semiconductor package 900 includes three semiconductor inductors 100A, 100B, and 100C. TMVs 910 conductively couple semiconductor inductors 100A and 100C to the active die 230. Semiconductor inductors 100A and 100C are encapsulated by the mold compound 250 forming the eWLB semiconductor package 900. Semiconductor inductor 100B includes a magnetic material 270 cap disposed proximate the stop layer 120. Although two semiconductor inductors 100A, 100C are depicted coupled to the front side of the active die 230 using TMVs in FIG. 9, any number of semiconductor inductors 100 may be similarly coupled to the active die 230 using TMVs. Although a single semiconductor inductor 100B is depicted coupled to the lower surface of the active die 230, any number of semiconductor inductors may be similarly coupled to the lower surface of the active die 230.

Figure 10:
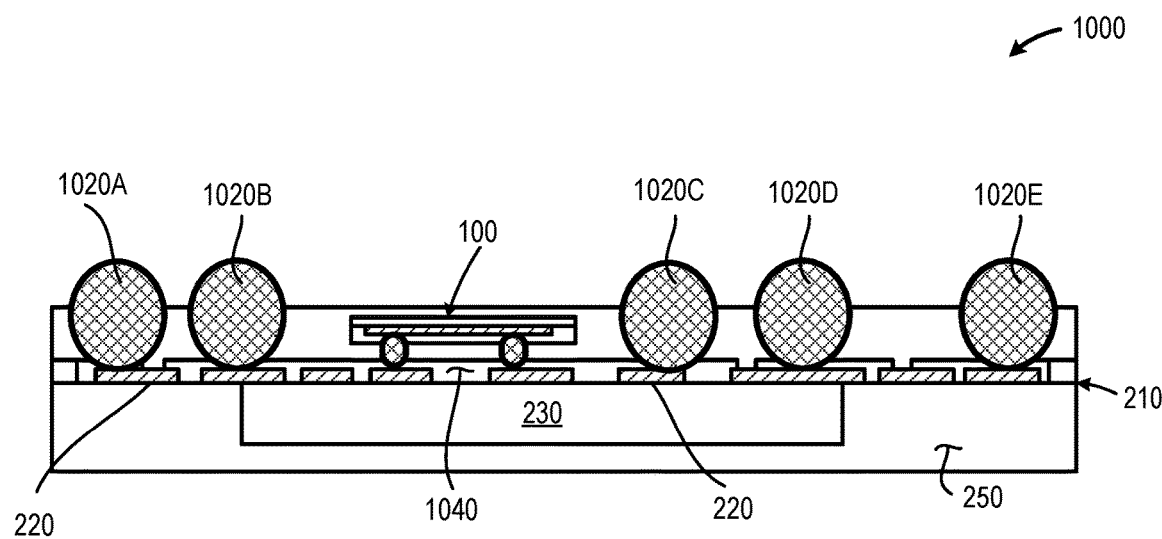
FIG. 10 is a cross-sectional elevation of an illustrative wafer level chip scale package (WLCSP) semiconductor package in which a semiconductor inductor is conductively coupled to the upper surface of the active die, in accordance with at least one embodiment described herein.

FIG. 10 is a cross-sectional elevation of an illustrative embedded wafer level ball grid array (eWLB) semiconductor package 1000 in which a semiconductor inductor 100 is conductively coupled to the upper surface of the active die 230, in accordance with at least one embodiment described herein. A mold compound 250 may be used to cover the upper surface of the active die 210 and may encapsulate the semiconductor inductor 100. In such embodiments, the pads 220 on the upper surface of the active die 230 may be opened, for example using one or more laser ablation or other similar selective material removal processes, and the solder balls 1020 inserted to conductively couple the eWLB semiconductor package 1000 to an external device. In embodiments, a solder-resist 1040 may be disposed about some or all of the pads 220. Although a single semiconductor inductor 100 is depicted coupled to the upper surface of the active die 230, any number of semiconductor inductors may be similarly coupled to the upper surface of the active die 210. In embodiments, the semiconductor inductor 100 may be conductively coupled to the upper surface of the active die using any conductive coupling method including, but not limited to, solder balls, solder bumps, conductive pillars, and/or solder paste.

Figure 11:
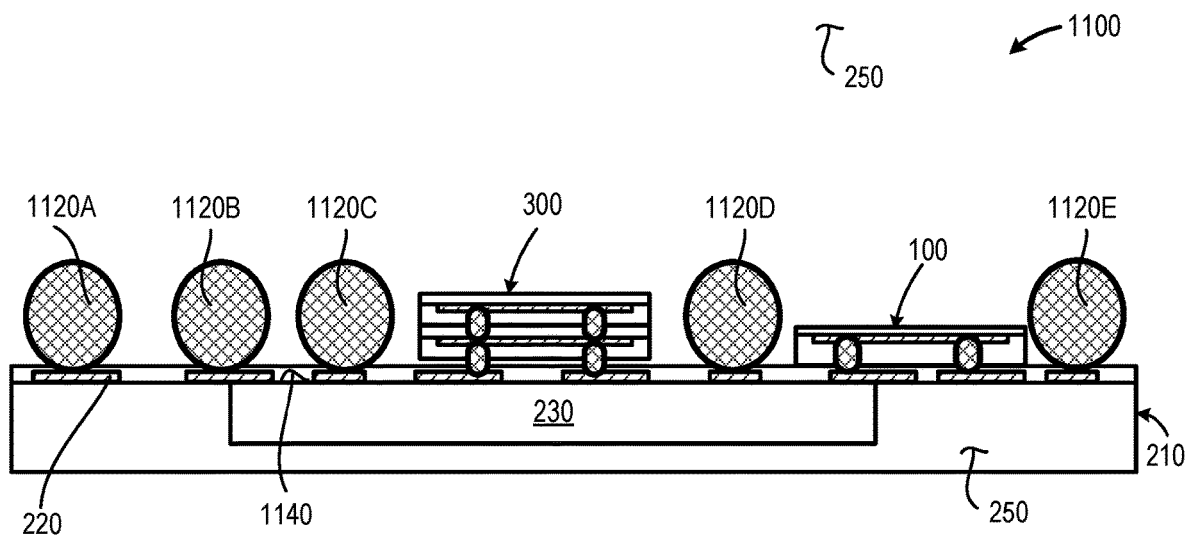
FIG. 11 is a cross-sectional elevation of an embedded wafer level ball grid array (eWLB) semiconductor package that includes a mold compound disposed on the lower surface of the active die and a removable etch resist disposed on the upper surface of the active die, in accordance with at least one embodiment described herein.

FIG. 11 is a cross-sectional elevation of an embedded wafer level ball grid array (eWLB) semiconductor package 1100 that includes a mold compound 250 disposed on the lower surface of the active die 230 and a removable etch resist 430 disposed on the upper surface of the active die 230, in accordance with at least one embodiment described herein. In embodiments, a solder-resist 1140 may be disposed about some or all of the pads 220. After forming the semiconductor inductors 100 and 300, the removable etch resist layer 430 may be removed exposing the pads 220 on the upper surface of the active die 230. Solder balls 220 may be attached to some or all of the exposed pads 220. The resultant eWLB semiconductor package 1100 may include exposed solder balls and semiconductor inductors 100 and 300 conductively coupled to the upper surface of the active die 230. Although only two semiconductor inductors are depicted coupled to the upper surface of the active die 230, any number of semiconductor inductors may be similarly coupled to the upper surface of the active die 230.

Figure 12:
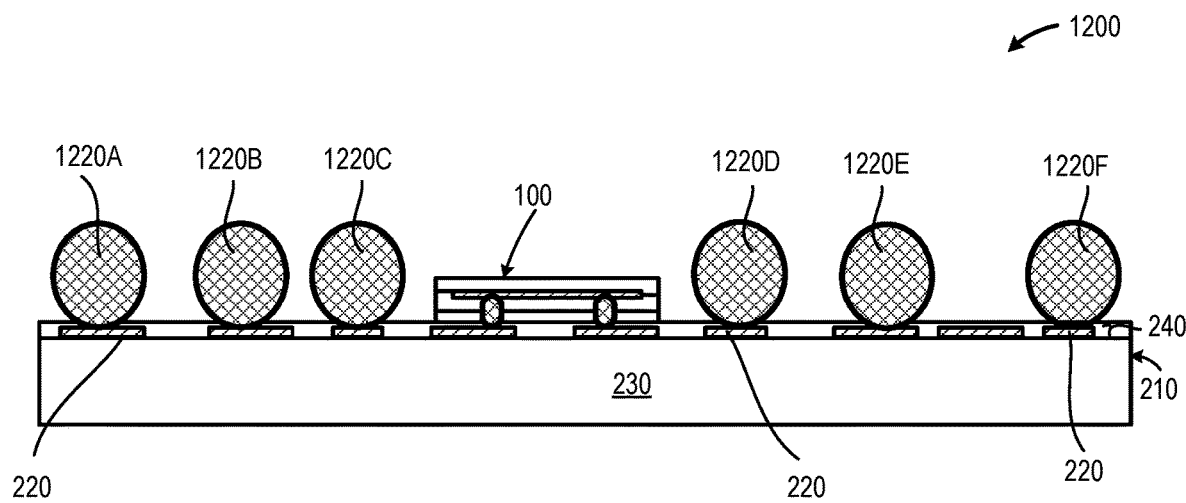
FIG. 12 is a cross-sectional elevation of an illustrative wafer level chip scale package (WLCSP) semiconductor package in which a semiconductor inductor is fabricated using a removable etch resist and conductively coupled to the upper surface of the active die, in accordance with at least one embodiment described herein.

FIG. 12 is a cross-sectional elevation of an illustrative wafer level chip scale package (WLCSP) semiconductor package 1200 in which a semiconductor inductor 100 is fabricated using a removable etch resist 430 and conductively coupled to the upper surface of the active die 210, in accordance with at least one embodiment described herein. In embodiments, a solder-resist 1140 may be disposed about some or all of the pads 220. A removable etch resist 430 may be deposited about the semiconductor inductor 100 and may cover some or all of the pads 220 on the upper surface of the active die 210. After forming the semiconductor inductor 100, the removable etch resist 430 may be removed, exposing the pads 220. Solder balls 1220A-1220F (collectively, "solder balls 1220") may then be conductively coupled to some or all of the exposed pads 220. The resultant WLCSP semiconductor package may include exposed solder balls 1220 and an exposed semiconductor inductor 100. Although a single semiconductor inductor 100 is depicted coupled to the upper surface of the active die 210, any number of semiconductor inductors may be similarly coupled to the upper surface of the active die 210.

Figure 13:
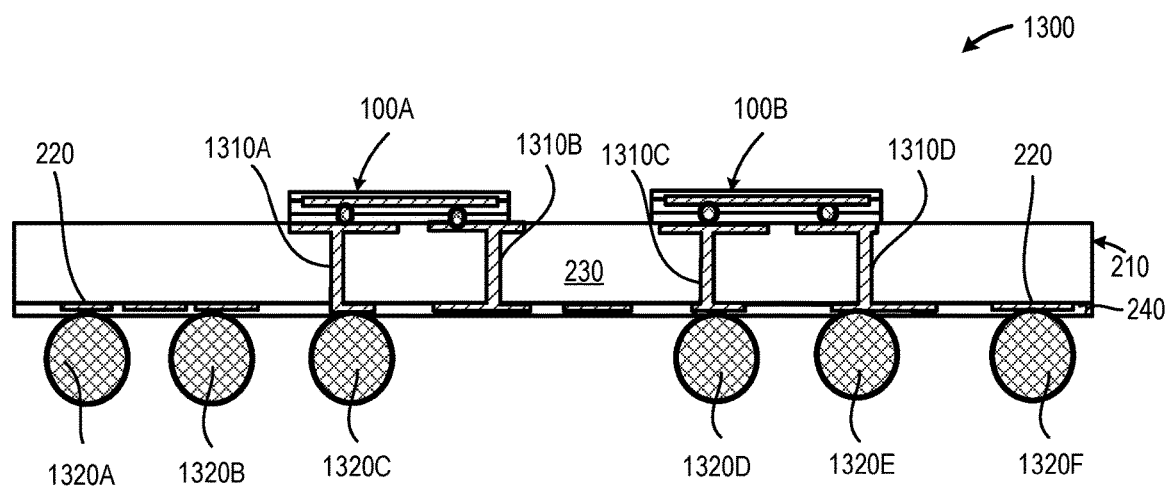
FIG. 13 is a cross-sectional elevation of an illustrative wafer level chip scale package (WLCSP) semiconductor package in which semiconductor inductors are fabricated using a removable etch resist and conductively coupled to the active die by through silicon vias (TSVs), in accordance with at least one embodiment described herein.

FIG. 13 is a cross-sectional elevation of an illustrative wafer level chip scale package (WLCSP) semiconductor package 1300 in which semiconductor inductors 100 are fabricated using a removable etch resist 430 and conductively coupled to the active die 210 by through silicon vias (TSVs) 1310A-1310D (collectively, "TSVs"), in accordance with at least one embodiment described herein. In embodiments, a solder-resist 1140 may be disposed about some or all of the pads 220. A removable etch resist 430 may be deposited about the semiconductor inductors 100 on the surface of the silicon substrate 230 of the active die 210. After forming the semiconductor inductor 100, the removable etch resist 430 may be removed exposing the underlying silicon substrate 230. Solder balls 1320A-1320F (collectively, "solder balls 1320") may then be conductively coupled to some or all of the exposed pads 220 on the active surface 210. The resultant WLCSP semiconductor package may include exposed solder balls 1220 on the active die 210 and exposed semiconductor inductors 100A and 100B on the silicon substrate 230, opposite the active die 210. Although two semiconductor inductors 100A and 100B are depicted coupled to the surface of the silicon substrate 230, any number of semiconductor inductors may be similarly coupled to the surface of the silicon substrate 230.

Figure 14:
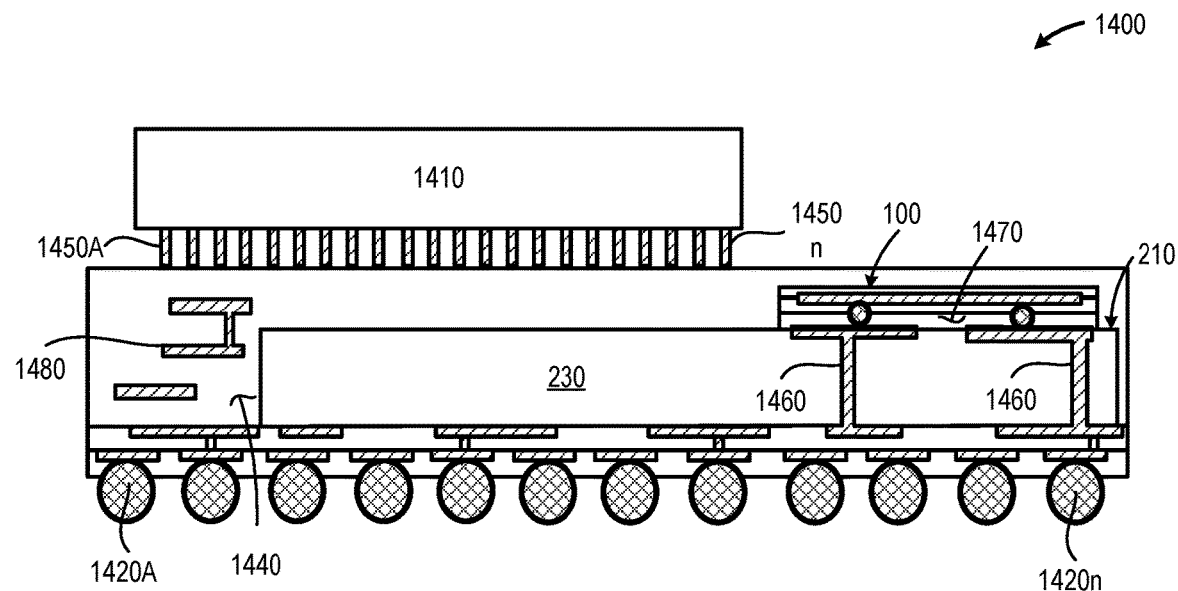
FIG. 14 is a cross-sectional elevation of an illustrative stacked die in which conductive members, such as copper pillars, couple a second semiconductor die to an active die encapsulated in a dielectric material and in which the active die is conductively coupled to a redistribution layer, in accordance with at least one embodiment described herein.

FIG. 14 is a cross-sectional elevation of an illustrative stacked die in which conductive members 1450, such as copper pillars, couple a second semiconductor die 1410 to an active die 210 encapsulated in a dielectric material 1440 and in which the active die 210 is conductively coupled to a redistribution layer, in accordance with at least one embodiment described herein. As depicted in FIG. 14, the semiconductor inductor 100 may be conductively coupled to the surface of the silicon substrate 230 that this opposite the active die 210 using a number of through silicon vias (TSVs) 1460. Also as depicted in FIG. 14, an underfill may be disposed at least partially between the semiconductor inductor 100 and the surface of the silicon substrate 230. The dielectric material 1440 may also encapsulate a number of conductive layers 1480. A plurality of solder balls 1420 may be conductively coupled to the redistribution layer.

Figure 15:
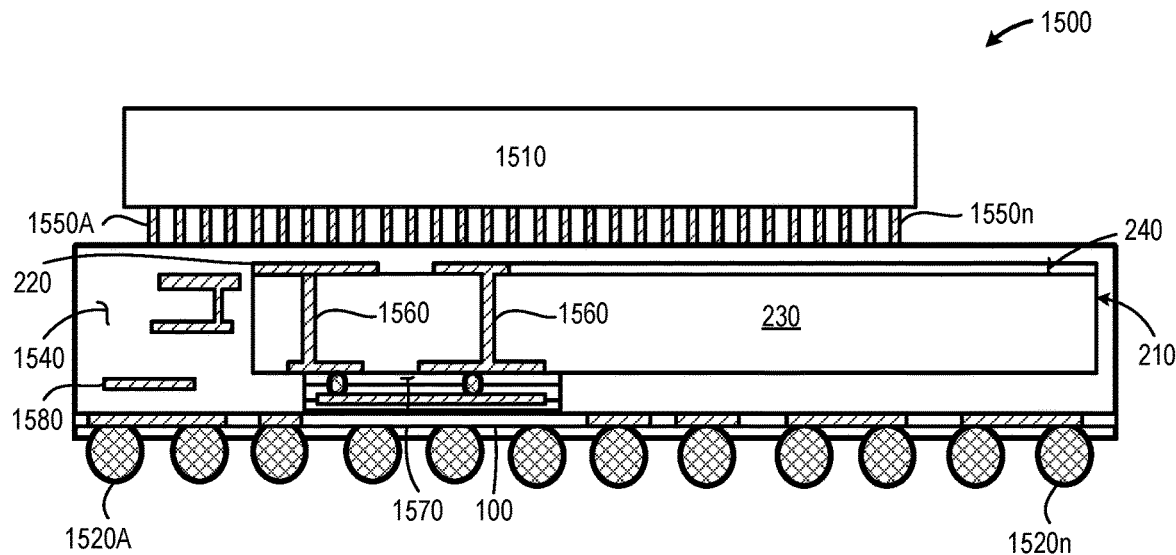
FIG. 15 is a cross-sectional elevation of an illustrative stacked die in which conductive members, such as copper pillars, couple a second semiconductor die to an active die coupled to a semiconductor inductor and in which the active die is conductively coupled to a redistribution layer, in accordance with at least one embodiment described herein.

FIG. 15 is a cross-sectional elevation of an illustrative stacked die in which conductive members 1550, such as copper pillars, couple a second semiconductor die 1510 to an active die 210 coupled to a semiconductor inductor 100 and in which the active die 210 is conductively coupled to a redistribution layer, in accordance with at least one embodiment described herein. As depicted in FIG. 15, the semiconductor inductor 100 may be conductively coupled to the second semiconductor die 1510 using a number of through silicon vias (TSVs) 1560. Also as depicted in FIG. 15, an underfill may be disposed at least partially between the semiconductor inductor 100 and the surface of the silicon substrate 230. The dielectric material 1540 may also encapsulate a number of conductive layers 1580. A plurality of solder balls 1520 may be conductively coupled to the active layer 210.

Figure 16:
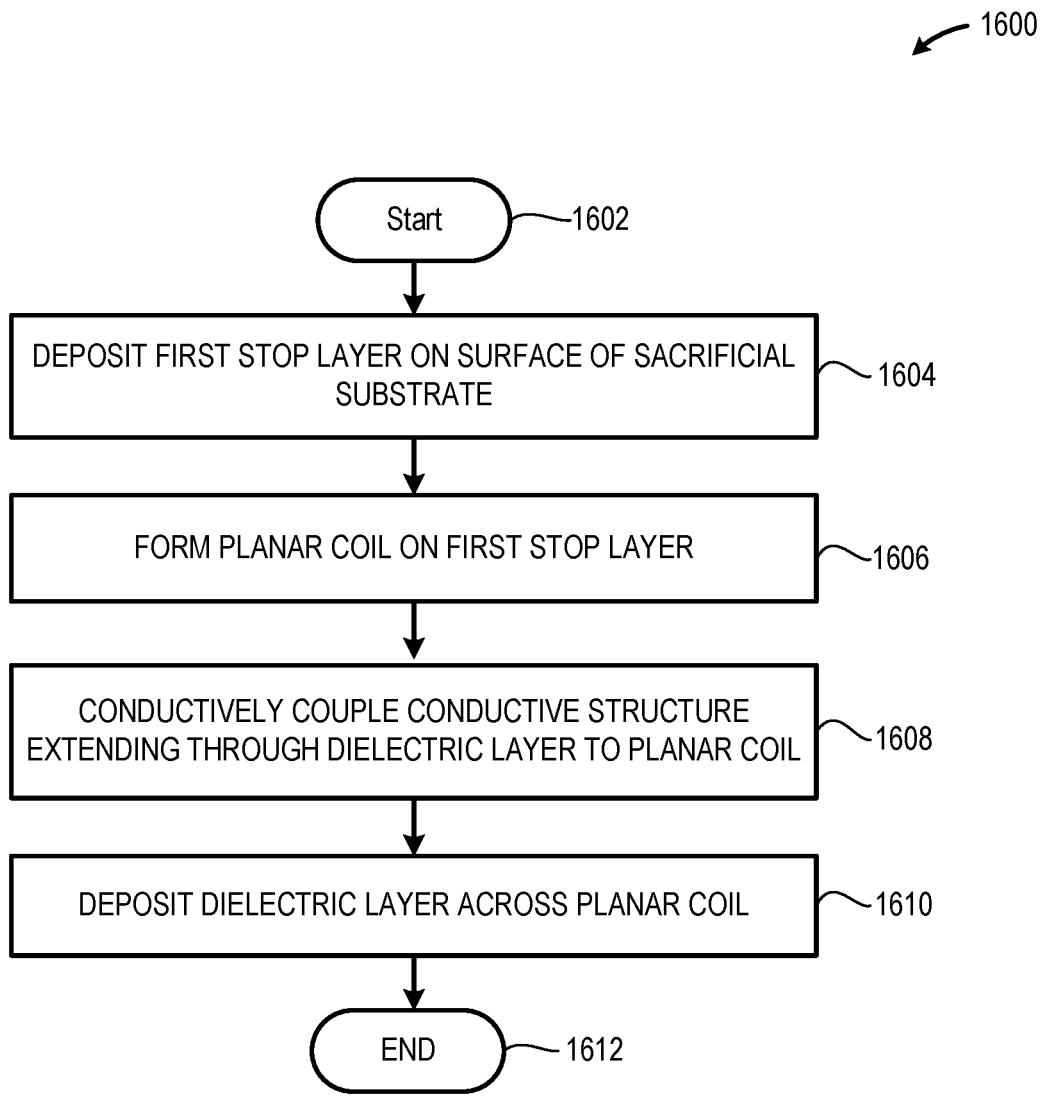
FIG. 16 is a high-level flow diagram of an illustrative semiconductor inductor fabrication method in which a planar coil having one or more windings is formed or otherwise patterned onto a stop layer that has been deposited on a sacrificial substrate, in accordance with at least one embodiment described herein.

FIG. 16 is a high-level flow diagram of an illustrative semiconductor inductor fabrication method 1600 in which a planar coil 110 having one or more windings is formed or otherwise patterned onto a stop layer 120 that has been deposited on a sacrificial substrate 130, in accordance with at least one embodiment described herein. The presence of the sacrificial substrate 130 beneficially and advantageously provides structural support for the coil 110. In embodiments, the sacrificial substrate 130 may include a silicon substrate which permits the fabrication of a plurality of semiconductor inductors 100 on a silicon wafer. The semiconductor inductors 100 are singulated for coupling to active dies 210. In embodiments, the active dies 210 may be formed on a silicon wafer and the semiconductor inductors 100 may be coupled to the active dies prior to singulation of the active dies. After coupling to the active die 210, the sacrificial substrate may be removed from the semiconductor inductor 100 and the resultant package encapsulated in mold compound or forwarded for additional processing. The method 1600 commences at 1602.

At 1604, a stop layer 120 is deposited on a sacrificial substrate 130. In embodiments, the stop layer 120 may include any substance capable of halting an etching or similar material removal process used to remove the sacrificial substrate 130 from the semiconductor inductor 100. Thus, the sacrificial substrate 130, stop layer 120, and etching or material removal process may be thought of as a system in which the sacrificial substrate 130 and stop layer 120 are selected based on a preferred etching process or in which the stop layer 120 and etching process are selected based on a preferred substrate 130. The stop layer 120 may be deposited on the sacrificial substrate using any currently available or future developed deposition process. Example deposition processes include, but are not limited to: chemical vapor deposition, physical vapor deposition, molecular beam epitaxy; electrochemical deposition; plasma enhanced chemical vapor deposition; spin coating; and similar. The stop layer 120 may have any thickness. For example, the stop layer 120 may have a thickness of less than: about 20 nanometers (nm); about 30 nm; about 50 nm; about 70 nm; about 90 nm; or about 130 nm.

The sacrificial substrate 130 provides structural support for the coil 110 and the stop layer 120 until fabrication of the coil structure is complete and the coil 110 is coupled to an active die.

The sacrificial substrate 130 beneficially provides structural support for the coil 110 prior to communicably coupling the coil 110 to an active die and may be removed from the coil 110 once the coil is coupled to the active die, thereby beneficially reducing both the weight and thickness of the resultant semiconductor package. In embodiments, the sacrificial substrate may contain silicon. In embodiments, a silicon wafer may provide the sacrificial substrate 130 and multiple coils may be formed on the wafer prior to singulation. The sacrificial substrate 130 may have any thickness. For example, the sacrificial substrate 130 may have a thickness of less than: about 800 micrometers (μm); about 700 μm; about 600 μm; about 500 μm; about 400 μm; about 300 μm; or about 200 μm. Where a silicon wafer is used to provide the sacrificial substrate 130, the silicon wafer may have a diameter of: about 450 millimeter (mm); about 300 mm; about 200 mm; about 150 mm; about 130 mm; about 100 mm; about 76 mm; about 50 mm; or about 25 mm.

At 1606, a coil 110 is formed or otherwise patterned on, across, or about at least a portion of the stop layer 120. The coil 110 may have any size, shape, and/or geometry. The coil 110 may have one or more turns or windings. The coil 110 may be patterned onto the stop layer 120 using any currently available or future developed deposition technique. The coil 110 may be fabricated from any conductive material including, but not limited to, one or more metals or metal alloys, one or more conductive polymers, or one or more conductive non-metallic materials, such as graphene. Example metals may include, but are not limited to: copper, copper alloys, aluminum, and aluminum alloys. The conductors forming the coil may have any width and/or thickness. For example, the coil 110 may have a width of greater than: about 5 nanometers (nm); about 7 nm; about 10 nm; about 15 nm; about 20 nm; about 30 nm; or about 50 nm.

At 1608, one or more conductive structures 140 may be conductively coupled to the coil 110. The one or more conductive structures 140 may include any device or feature capable of conductively coupling the inductor 100 to an external system, such as an active die. In embodiments, the conductive structures 140 may physically affix the inductor 100 to an external device or system. In some implementations, the conductive structures 140 may include one or more solder balls. In some implementations, the conductive structures 140 may include one or more conductive pillars. In some implementations, the conductive structures 140 may include solder bumps.

At 1610, a dielectric layer 150 is deposited across all or a portion of the coil 110 and across all or a portion of the stop layer 120, at least partially encapsulating the coil 110. The dielectric layer 150 is disposed on, across, or about the coil 110 and on, across, or about the stop layer 120. In embodiments, the dielectric layer 150 encapsulates the coil 110 and at least partially encapsulates the conductive structures 140. In embodiments, at least a portion of the conductive structures 140 may extend or project beyond the surface of the dielectric layer 150 opposite the coil 110. The dielectric layer may include one or more electrically insulating materials. Example dielectric materials include, but are not limited to: nanoporous silica; hydrogensilsesquioxanes (HSQ); Teflon®-AF (polytetrafluoethylene or PTFE); silicon oxyflouride (FSG); silicon dioxide ($SiO_2$); silicon nitride; alkali halides; barium titanate ($BaTiO_3$); hafnium oxide ($HfO_2$); tantalum oxide ($TaO_5$); tungsten oxide ($WO_3$); zirconium oxide ($ZrO_2$); and similar. The method 1600 concludes at 1612.

Figure 17:
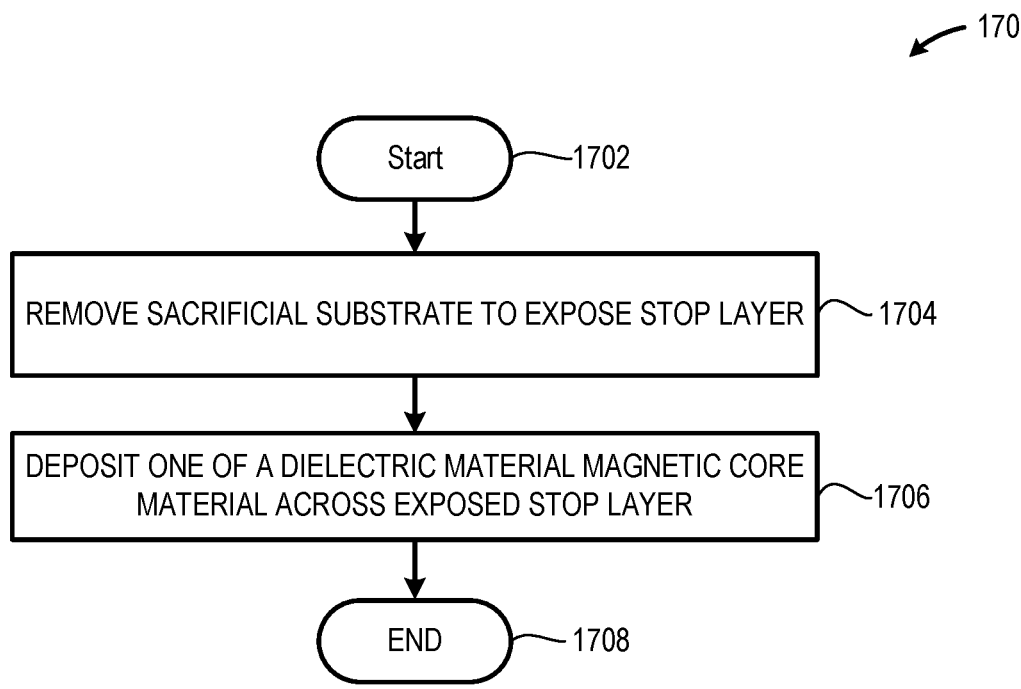
FIG. 17 is a high-level flow diagram of an illustrative semiconductor inductor fabrication method in which at least a portion of the sacrificial substrate is removed to expose the stop layer, in accordance with at least one embodiment described herein.

FIG. 17 is a high-level flow diagram of an illustrative semiconductor inductor fabrication method 1700 in which at least a portion of the sacrificial substrate 130 is removed to expose the stop layer 120, in accordance with at least one embodiment described herein. The method 1700 may be used in conjunction with the method 1600 described in detail above. In embodiments, the removal of the sacrificial substrate 130 may occur after physical attachment of the semiconductor inductor 100 to an active die 210, based at least in part, on the structural strength and rigidity the sacrificial substrate 130 provides during the semiconductor inductor 100 attachment process. In embodiments, the sacrificial substrate 130 may be removed after attaching the semiconductor inductor 100 to an active die and after at least partially embedding the semiconductor inductor 100 in a mold compound 250 or removable etch resist 430. The method 1700 commences at 1702.

At 1704, at least a portion of the sacrificial substrate 130 is removed from the semiconductor inductor 100. In embodiments where the semiconductor inductor 100 has been at least partially encapsulated in mold compound 250 or removable etch resist 430, the removal of the sacrificial substrate 130 creates a void 260 proximate the semiconductor inductor 100 while the mold compound 250 or removable etch resist 430 remains unaffected. In embodiments, all or a portion of the thickness of the sacrificial substrate 130 may be removed using wet chemistry on a spin etcher. In embodiments, the etching process may halt upon reaching the stop layer 120.

At 1706, at least one of a dielectric material 270 and/or a magnetic material 280 is deposited in the void 260 formed above the semiconductor inductor 100 by the removal of the sacrificial substrate 130. In embodiments, the dielectric material 270 may include mold compound similar to that previously deposited about at least a portion of the perimeter of the semiconductor inductor 100. In embodiments, the magnetic material 280 may include one or more non-electrically conductive materials demonstrating magnetic properties. Example magnetic materials may include one or more soft magnetic composite materials, such as one or more ferritic materials encapsulated in a non-electrically conductive material or polymer). The top surface of the dielectric material 270 and/or the magnetic material 180 may be finished flush with the surrounding mold compound 250 using one or more surface finishing techniques, such as chemical mechanical planarization (CMP). The method 1700 concludes at 1708.

Figure 18:
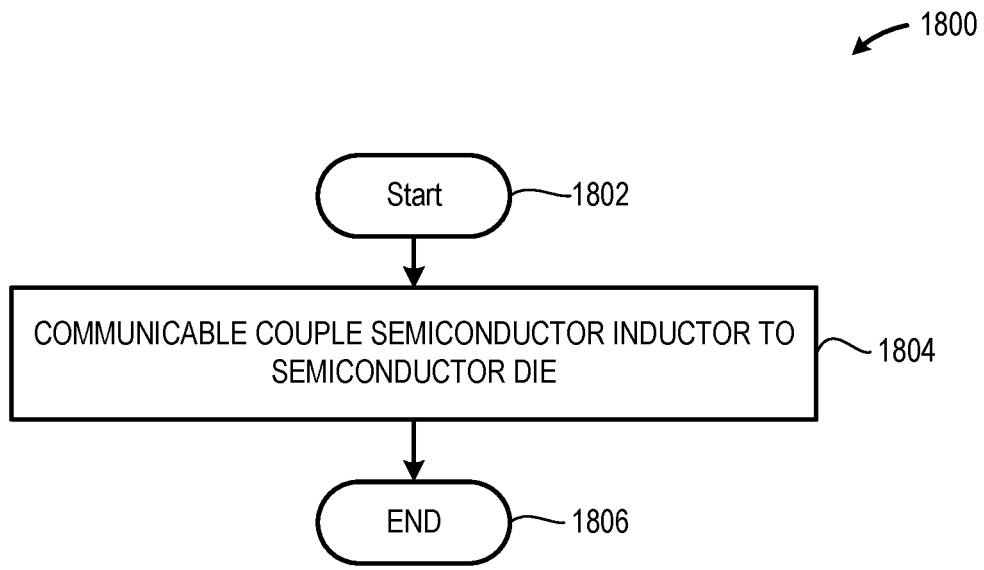
FIG. 18 is a high-level flow diagram of an illustrative semiconductor package fabrication method in which the semiconductor inductor is conductively coupled to an active die, in accordance with at least one embodiment described herein.

FIG. 18 is a high-level flow diagram of an illustrative semiconductor package fabrication method 1800 in which the semiconductor inductor 100 is conductively coupled to an active die 210, in accordance with at least one embodiment described herein. The method 1800 commences at 1802.

At 1804, the semiconductor inductor 100 is conductively coupled to the active die 210. In embodiments, the semiconductor inductor 100 may be coupled directly to the surface of the active die 210. In embodiments, the semiconductor inductor 100 may be physically coupled to a substrate material 230 on which the active die 210 is formed and may be conductively coupled to the active die 210 using one or more through-silicon vias (TSVs). In other embodiments, the semiconductor inductor 100 may be physically coupled to an active die 210 using one or more through mold vias (TMVs). The method 1800 concludes at 1806.

While FIGS. 16 through 18 illustrate various operations according to one or more embodiments, it is to be understood that not all of the operations depicted in FIGS. 16 through 18 are necessary for other embodiments. Indeed, it is fully contemplated herein that in other embodiments of the present disclosure, the operations depicted in FIGS. 16 through 18, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for fabricating a semiconductor inductor that includes a coil deposited on a stop layer that is deposited on a sacrificial substrate. The semiconductor inductor may be fabricated on a silicon wafer and singulated. The sacrificial substrate beneficially provides structural support for the singulated semiconductor inductor. The singulated semiconductor inductor advantageously requires minimal active die surface area. The removal of the sacrificial substrate after coupling to the active die beneficially reduces the overall thickness (or height) of the semiconductor package, providing a decided advantage in low profile, portable, electronic devices.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for fabricating a low-profile semiconductor inductor on a sacrificial substrate that can be coupled to an active die prior to singulation of the silicon wafer.

According to example 1, there is provided a semiconductor inductor. The semiconductor inductor may include: a first sacrificial substrate having a thickness, a first surface and a transversely opposed second surface; a first stop layer deposited across at least a portion of the first surface of the first sacrificial substrate; a first coil having a first surface and a second surface deposited across at least a portion of the first stop layer opposite the first sacrificial substrate; a first dielectric layer having a thickness disposed at least partially across the first coil; and at least one first conductive structure conductively coupled to the first coil and extending through the first dielectric layer thickness and projecting at least partially from the surface of the first dielectric layer opposite the first coil.

Example 2 may include elements of example 1 where the stop layer may include silicon carbide.

Example 3 may include elements of example 1 where the at least one conductive structure may include at least one of: a solder ball, a solder bump, or a conductive solder paste.

Example 4 may include elements of example 1 where the at least one conductive structure may include a conductive pillar.

Example 5 may include elements of example 1 where the first coil may include a planar coil having a plurality of turns disposed on the first stop layer.

Example 6 may include elements of example 1, and the semiconductor inductor may additionally include: a second coil disposed proximate and conductively coupled to the first coil by one or more second conductive structures extending through the first stop layer after removal of at least a portion of the first sacrificial substrate; where the second coil has a first surface disposed proximate a second dielectric layer and a second surface deposited across at least a portion of a second stop layer; and where the second conductive structures extend through the second dielectric layer.

Example 7 may include elements of example 6 where the second coil is spaced a distance from the first coil, forming an interstitial space between the first oil and the second coil.

Example 8 may include elements of example 7, and the semiconductor inductor may additionally include an underfill at least partially filling the interstitial space between the first coil and the second coil.

Example 9 may include elements of example 1, and the semiconductor inductor may additionally include a magnetic core material disposed proximate at least a portion of the first stop layer after removal of at least a portion of the first sacrificial substrate.

Example 10 may include elements of any of examples 1 through 9 where the first sacrificial substrate comprises a silicon wafer.

According to example 11, there is provided a method of fabricating a first semiconductor inductor. The method may include: depositing a first stop layer across at least a portion of a first surface of a first sacrificial substrate; forming a first coil having a first surface and an opposed second surface across at least a portion of the first stop layer opposite the first sacrificial substrate; depositing a first dielectric layer having a thickness at least partially across the first coil; and conductively coupling at least one first conductive structure to the first coil, the at least one first conductive structure extending through the thickness of the first dielectric layer and projecting at least partially from the surface of the first dielectric layer opposite the first coil.

Example 12 may include elements of example 11, and the method may further include: removing at least a portion of the first sacrificial substrate to expose at least a portion of the first stop layer.

Example 13 may include elements of example 11 where removing at least a portion of the first sacrificial substrate to expose at least a portion of the first stop layer may include: removing at least a portion of the first sacrificial substrate via spin etching to expose the portion of the first stop layer.

Example 14 may include elements of example 11, and the method may additionally include: depositing a magnetic core material across at least a portion of the exposed portion of the first stop layer.

Example 15 may include elements of example 11, and the method may additionally include: forming a second semiconductor inductor by: depositing a second stop layer across at least a portion of a first surface of a second sacrificial substrate; forming a second coil having a first surface and an opposed second surface across at least a portion of the second stop layer opposite the second sacrificial substrate; depositing a second dielectric layer having a thickness at least partially across the second coil; and conductively coupling at least one second conductive structure to the second planar coil, the at least one second conductive structure extending through the thickness of the second dielectric layer and projecting at least partially from the surface of the second dielectric layer opposite the second coil; and conductively coupling the at least one second conductive structure to the first coil, the at least one second conductive structure extending through the first stop layer thickness.

Example 16 may include elements of example 15, and the method may additionally include: an underfill at least partially filling an interstitial space between the first coil and the second coil.

Example 17 may include elements of example 11 where depositing a first stop layer across at least a portion of a first surface of a first sacrificial substrate may include: depositing a first stop layer that includes silicon carbide across at least a portion of a first surface of a first sacrificial substrate.

Example 18 may include elements of example 11 where conductively coupling at least one first conductive structure to the first coil may include: conductively coupling at least one first conductive structure that includes a solder ball to the first coil.

Example 19 may include elements of example 11 where conductively coupling at least one first conductive structure to the first coil may include: conductively coupling at least one first conductive structure that includes a conductive pillar to the first planar coil.

Example 20 may include elements of example 11 where forming a first coil may include: forming a first coil that includes a plurality of turns.

Example 21 may include elements of example 11 where forming a first coil across at least a portion of the first stop layer opposite the first sacrificial substrate may include: patterning a first planar coil across at least a portion of the first stop layer opposite the first sacrificial substrate.

Example 22 may include elements of any of examples 11 through 21 where forming a first coil across at least a portion of the first stop layer opposite the first sacrificial substrate may include: forming a first coil across at least a portion of the first stop layer opposite a first sacrificial silicon substrate.

According to example 23, there is provided a semiconductor package. The semiconductor package may include: a semiconductor die; a semiconductor inductor conductively coupled to the semiconductor die, the semiconductor inductor including: a first sacrificial substrate having a thickness, a first surface and a second surface; a first stop layer deposited across at least a portion of the first surface of the first sacrificial substrate; a first coil having a first surface and a second surface deposited across at least a portion of the first stop layer opposite the first sacrificial substrate; a first dielectric layer having a thickness disposed at least partially across the first coil; and at least one first conductive structure conductively coupled to the first coil and extending through the thickness of the first dielectric layer and projecting at least partially from the surface of the first dielectric layer opposite the first coil, the at least one first conductive structure conductively coupled to the semiconductor die.

Example 24 may include elements of example 23, and the semiconductor package may additionally include: a mold compound disposed across at least a portion of the semiconductor die and at least partially about the semiconductor inductor.

Example 25 may include elements of example 23, and the semiconductor package may additionally include: a mold compound disposed across at least a portion of the semiconductor die and across at least a portion of the first stop layer of the semiconductor inductor after removal of at least a portion of the thickness of the first sacrificial substrate.

Example 26 may include elements of example 23 where the sacrificial substrate may include a silicon wafer.

Example 27 may include elements of example 23 where the stop layer may include silicon carbide.

Example 28 may include elements of example 23 where the at least one conductive structure may include a solder ball.

Example 29 may include elements of example 23 where the at least one conductive structure may include a conductive pillar.

Example 30 may include elements of example 23 where the first coil comprises a coil having a plurality of turns.

Example 31 may include elements of example 23, and the semiconductor package may additionally include: a second coil disposed proximate and conductively coupled to the first coil by one or more second conductive structures extending through the first stop layer after removal of at least a portion of the first sacrificial layer; where the second coil has a first surface disposed proximate a second dielectric layer and an opposed second surface deposited across at least a portion of a second stop layer; and where the second conductive structures extend through the second dielectric layer.

Example 32 may include elements of example 31 where the second coil is spaced a distance from the first coil, forming an interstitial space between the first coil and the second coil.

Example 33 may include elements of example 32, and the semiconductor package may additionally include: an underfill at least partially filling the interstitial space between the first coil and the second coil.

Example 34 may include elements of example 23, and the semiconductor inductor may additionally include: a magnetic core material disposed proximate at least a portion of the first stop layer after removal of at least a portion of the first sacrificial substrate.

Example 35 may include elements of example 23, and the semiconductor inductor may additionally include: a mold compound disposed across at least a portion of the semiconductor die and at least partially about the semiconductor inductor.

Example 36 may include elements or example 23, and the semiconductor inductor may additionally include: an etch-resist compound disposed across at least a portion of the semiconductor die and about at least a portion of the first sacrificial substrate.

Example 37 may include elements of example 36, and the semiconductor inductor may additionally include: a magnetic core material disposed proximate at least a portion of the first stop layer after removal of at least a portion of the first sacrificial substrate.

According to example 38, there is provided a method of fabricating a first semiconductor package. The method may include: the method comprising: forming a semiconductor inductor by: depositing a first stop layer across at least a portion of a first surface of a first sacrificial substrate having a first thickness; forming a first coil having a first surface and an opposed second surface across at least a portion of the first stop layer opposite the first sacrificial substrate; depositing a first dielectric layer having a thickness at least partially across the first coil; and conductively coupling at least one first conductive structure to the first coil, the at least one first conductive structure extending through the thickness of the first dielectric layer and projecting at least partially from the surface of the first dielectric layer opposite the first coil; and conductively coupling the semiconductor inductor to a semiconductor die using the at least one conductive structure.

Example 39 may include elements of example 38, and the method may additionally include: disposing a mold compound across at least a portion of the semiconductor die and at least partially about the semiconductor inductor.

Example 40 may include elements of example 39, and the method may additionally include: removing at least a portion of the first sacrificial substrate to expose at least a portion of the first stop layer.

Example 41 may include elements of example 40, and the method may additionally include: depositing a magnetic core material across at least a portion of the exposed portion of the first stop layer.

Example 42 may include elements of example 40 where removing at least a portion of the first sacrificial substrate to expose at least a portion of the first stop layer may include: removing at least a portion of the first sacrificial substrate via spin etching to expose the portion of the first stop layer.

Example 43 may include elements of example 38, and the method may additionally include: disposing a mold compound disposed across at least a portion of the semiconductor die and across at least a portion of the first semiconductor inductor stop layer after removing at least a portion of the first sacrificial substrate to expose at least a portion of the first stop layer.

Example 44 may include elements of example 38, and the method may additionally include: forming a second semiconductor inductor by: depositing a second stop layer across at least a portion of a first surface of a second sacrificial substrate; forming a second coil having a first surface and an opposed second surface across at least a portion of the second stop layer opposite the second sacrificial substrate; depositing a second dielectric layer having a thickness at least partially across the second coil; and conductively coupling at least one second conductive structure to the second planar coil, the at least one second conductive structure extending through the thickness of the second dielectric layer and projecting at least partially from the surface of the second dielectric layer opposite the second coil; and conductively coupling the at least one second conductive structure to the first coil, the at least one second conductive structure extending through the first stop layer thickness.

Example 45 may include elements of example 44, and the method may additionally include: at least partially filling an interstitial space between the first coil and the second coil using an underfill.

Example 46 may include elements of example 38 where depositing a first stop layer across at least a portion of a first surface of a first sacrificial substrate may include: depositing a first stop layer that includes silicon carbide across at least a portion of a first surface of a first sacrificial substrate.

Example 47 may include elements of example 38 where conductively coupling at least one first conductive structure to the first coil may include: conductively coupling at least one first conductive structure that includes a solder ball to the first coil.

Example 48 may include elements of example 38 where conductively coupling at least one first conductive structure to the first coil may include: conductively coupling at least one first conductive structure that includes a conductive pillar to the first coil.

Example 49 may include elements of example 38 where forming a first coil comprises: forming a first planar coil that includes a plurality of turns.

Example 50 may include elements of example 38 where forming a first coil across at least a portion of the first stop layer opposite the first sacrificial substrate comprises: patterning a first planar coil across at least a portion of the first stop layer opposite the first sacrificial substrate.

Example 51 may include elements of any of examples 38 through 50 where forming a first coil across at least a portion of the first stop layer opposite the first sacrificial substrate comprises: forming a first planar coil across at least a portion of the first stop layer opposite a first sacrificial silicon substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor inductor, comprising:
a first sacrificial substrate having a thickness, a first surface and a transversely opposed second surface;
a first stop layer across at least a portion of the first surface of the first sacrificial substrate;
a first coil having a first surface and an opposed second surface, the first coil across at least a portion of the first stop layer opposite the first sacrificial substrate;
a first dielectric layer having a thickness disposed at least partially across the first coil, wherein the first dielectric layer is directly on and in contact with the first stop layer; and
at least one first conductive structure conductively coupled to the first coil and extending through the first dielectric layer thickness and projecting at least partially from a surface of the first dielectric layer opposite the first coil.

2. The semiconductor inductor of claim 1 wherein the first stop layer comprises silicon carbide.

3. The semiconductor inductor of claim 1 wherein the at least one conductive structure comprises at least one of: a solder ball, a solder bump, or a solder paste.

4. The semiconductor inductor of claim 1 wherein the at least one conductive structure comprises a conductive pillar.

5. The semiconductor inductor of claim 1 wherein the first coil comprises a planar coil having a plurality of turns.

6. The semiconductor inductor of claim 1, further comprising:
a second coil disposed proximate and conductively coupled to the first coil by one or more second conductive structures extending through the first stop layer after removal of at least a portion of the first sacrificial substrate;
wherein the second coil has a first surface disposed proximate a second dielectric layer and an opposed second surface deposited across at least a portion of a second stop layer; and
wherein the second conductive structures extend through the second dielectric layer.

7. The semiconductor inductor of claim 6 wherein the second coil comprises a planar coil spaced a distance from the first coil, forming an interstitial space between the first coil and the second coil.

8. The semiconductor inductor of claim 7, further comprising:
an underfill at least partially filling the interstitial space between the first coil and the second coil.

9. The semiconductor inductor of claim 1, further comprising:
a magnetic core material disposed proximate at least a portion of the first stop layer after removal of at least a portion of the first sacrificial substrate.

10. The semiconductor inductor claim 1 wherein the first sacrificial substrate comprises a silicon wafer.

11. A method of fabricating a first semiconductor inductor, the method comprising:
depositing a first stop layer across at least a portion of a first surface of a first sacrificial substrate;
forming a first coil across at least a portion of the first stop layer opposite the first sacrificial substrate, the first coil having a first surface and an opposed second surface;
depositing a first dielectric layer having a thickness at least partially across the first coil, wherein the first dielectric layer is directly on and in contact with the first stop layer; and
conductively coupling at least one first conductive structure to the first coil, the at least one first conductive structure extending through the thickness of the first dielectric layer and projecting at least partially from a surface of the first dielectric layer opposite the first coil.

12. The method of claim 11, further comprising:
removing at least a portion of the first sacrificial substrate to expose at least a portion of the first stop layer.

13. The method of claim 11 wherein removing at least a portion of the first sacrificial substrate to expose at least a portion of the first stop layer comprises:
removing at least a portion of the first sacrificial substrate via spin etching to expose the portion of the first stop layer.

14. The method of claim 11, further comprising:
depositing a magnetic core material across at least a portion of the exposed portion of the first stop layer.

15. The method of claim 11, further comprising:
forming a second semiconductor inductor by:
depositing a second stop layer across at least a portion of a first surface of a second sacrificial substrate;
forming a second coil across at least a portion of the second stop layer opposite the second sacrificial substrate, the second coil having a first surface and an opposed second surface;
depositing a second dielectric layer having a thickness at least partially across the second coil; and
conductively coupling at least one second conductive structure to the second coil, the at least one second conductive structure extending through the thickness of the second dielectric layer and projecting at least partially from the surface of the second dielectric layer opposite the second coil; and
conductively coupling the at least one second conductive structure to the first coil, the at least one second conductive structure extending through the first stop layer thickness.

16. The method of claim 15, further comprising:
filling, at least partially, an interstitial space formed between the first coil and the planar coil with an underfill.

17. The method of claim 11 wherein depositing a first stop layer across at least a portion of a first surface of a first sacrificial substrate comprises:
depositing a first stop layer that includes silicon carbide across at least a portion of a first surface of a first sacrificial substrate.

18. The method of claim 11 wherein conductively coupling at least one first conductive structure to the first coil comprises:
conductively coupling at least one first conductive structure that includes a solder ball to the first coil.

19. The method of claim 11 wherein conductively coupling at least one first conductive structure to the first coil comprises:
conductively coupling at least one first conductive structure that includes a conductive pillar to the first coil.

20. The method of claim 11 wherein forming a first coil across at least a portion of the first stop layer opposite the first sacrificial substrate comprises:
forming a first planar coil that includes a plurality of turns across at least a portion of the first stop layer opposite the first sacrificial substrate.

21. The method of claim 11 wherein forming a first coil across at least a portion of the first stop layer opposite the first sacrificial substrate comprises:
patterning first planar coil across at least a portion of the first stop layer opposite the first sacrificial substrate.

22. The method of claim 11 wherein forming a first coil across at least a portion of the first stop layer opposite the first sacrificial substrate comprises:
forming a first coil across at least a portion of the first stop layer opposite a first sacrificial silicon substrate, the sacrificial silicon substrate comprising a silicon wafer.

23. A semiconductor package, comprising:
a semiconductor die;
a semiconductor inductor conductively coupled to the semiconductor die, the semiconductor inductor including:
a first stop layer;
a first coil having a first surface and an opposed second surface, the first coil across at least a portion of the first stop layer;
a first dielectric layer having a thickness disposed at least partially across the first coil, wherein the first dielectric layer is directly on and in contact with the first stop layer; and
at least one first conductive structure conductively coupled to the first coil and extending through the thickness of the first dielectric layer and projecting at least partially from a surface of the first dielectric layer opposite the first coil, the at least one first conductive structure conductively coupled to the semiconductor die.

24. The semiconductor package of claim 23, further comprising:
a mold compound disposed across at least a portion of the semiconductor die and at least partially about the semiconductor inductor.

25. The semiconductor package of claim 23, further comprising:
a mold compound disposed across at least a portion of the semiconductor die and across at least a portion of the first stop layer of the semiconductor inductor after removal of at least a portion of the thickness of the first sacrificial substrate.

* * * * *